(12) United States Patent
Gogoi et al.

(10) Patent No.: US 12,729,107 B2
(45) Date of Patent: Sep. 8, 2026

(54) ANCHOR STRUCTURE

(71) Applicant: Lawrence Semiconductor Research Laboratory, Inc., Tempe, AZ (US)

(72) Inventors: Bishnu Prasanna Gogoi, Scottsdale, AZ (US); Chantal Arena, Mesa, AZ (US)

(73) Assignee: Lawrence Semiconductor Research Laboratory, Inc., Tempe, AZ (US)

(*) Notice: Subject to any disclaimer, the term of this patent is extended or adjusted under 35 U.S.C. 154(b) by 351 days.

(21) Appl. No.: 18/361,619

(22) Filed: Jul. 28, 2023

(65) Prior Publication Data

US 2025/0033951 A1 Jan. 30, 2025

(51) Int. Cl.
*B81B 3/00* (2006.01)
*B81C 1/00* (2006.01)

(52) U.S. Cl.
CPC ........ *B81B 3/0072* (2013.01); *B81C 1/00039* (2013.01); *B81B 2201/0235* (2013.01); *B81B 2203/0163* (2013.01); *B81B 2203/0307* (2013.01); *B81B 2203/04* (2013.01); *B81C 2201/0104* (2013.01); *B81C 2201/0132* (2013.01); *B81C 2201/0177* (2013.01)

(58) Field of Classification Search
CPC ........ B81C 1/00039; B81B 2203/0307; B81B 3/0072; B81B 2201/0235; B81B 2203/0163; B81B 2203/04; B81B 3/0078
See application file for complete search history.

(56) References Cited

U.S. PATENT DOCUMENTS

| | | | |
|---|---|---|---|
| 5,879,963 | A | 3/1999 | Howe et al. |
| 5,963,818 | A | 10/1999 | Kao et al. |
| 6,055,858 | A | 5/2000 | Muenzel et al. |
| 6,194,722 | B1 | 2/2001 | Fiorini et al. |

(Continued)

FOREIGN PATENT DOCUMENTS

| | | | |
|---|---|---|---|
| TW | 200628396 | A | 6/2006 |
| WO | 2006130665 | A2 | 12/2006 |

(Continued)

OTHER PUBLICATIONS

Office Action, Taiwanese Patent Application TW 113128072, Sep. 18, 2025, 17 pages.

(Continued)

*Primary Examiner* — Moazzam Hossain
(74) *Attorney, Agent, or Firm* — Quarles & Brady LLP; Yakov S. Sidorin

(57) ABSTRACT

A semiconductor device is disclosed having one or more anchors that is configured to support a moving mass. The one or more anchors are formed in or on the semiconductor substrate. The one or more anchors are attached to the semiconductor substrate. An intermediate layer is formed overlying the semiconductor substrate. A device layer is formed overlying the intermediate layer. The device layer, the intermediate layer, and the semiconductor substrate are single crystal. The moving mass is formed in the device layer. The at least one anchor comprises a dielectric material coupled to the semiconductor substrate. The moving mass couples to the at least one anchor. Portions of the intermediate layer are removed to free the moving mass in relation the semiconductor substrate.

13 Claims, 23 Drawing Sheets

(56) References Cited

U.S. PATENT DOCUMENTS

| | | | | |
|---|---|---|---|---|
| 6,448,622 | B1 | 9/2002 | Franke et al. | |
| 6,524,878 | B2 | 2/2003 | Abe et al. | |
| 6,569,701 | B2 | 5/2003 | Knieser et al. | |
| 6,756,310 | B2 | 6/2004 | Kretschmann et al. | |
| 6,768,628 | B2 | 7/2004 | Harris et al. | |
| 6,913,941 | B2 | 7/2005 | O'Brien et al. | |
| 6,916,728 | B2 | 7/2005 | Gogoi et al. | |
| 7,018,550 | B2 | 3/2006 | Harris et al. | |
| 7,122,395 | B2 | 10/2006 | Gogoi | |
| 7,176,111 | B2 | 2/2007 | Baert et al. | |
| 7,387,737 | B2 | 6/2008 | Harris et al. | |
| 10,571,681 | B2 | 2/2020 | Meier et al. | |
| 11,923,313 | B2 | 3/2024 | Costa et al. | |
| 2004/0121564 | A1* | 6/2004 | Gogoi | B81B 3/001 438/479 |
| 2005/0124089 | A1* | 6/2005 | Gogoi | B81C 1/00293 438/52 |
| 2009/0170231 | A1* | 7/2009 | Robert | B81C 1/00484 977/932 |
| 2010/0297781 | A1* | 11/2010 | Scheurle | B81C 1/00714 438/481 |
| 2015/0338246 | A1* | 11/2015 | Robert | H01G 5/16 324/661 |
| 2016/0118255 | A1* | 4/2016 | Qi | H10P 14/38 438/479 |
| 2016/0221824 | A1 | 8/2016 | Alper et al. | |
| 2017/0129769 | A1* | 5/2017 | Geisberger | B81B 7/0048 |
| 2017/0301697 | A1* | 10/2017 | Reznicek | H10D 86/215 |
| 2022/0162058 | A1 | 5/2022 | Hsieh et al. | |
| 2023/0260921 | A1 | 8/2023 | Costa et al. | |
| 2024/0038582 | A1 | 2/2024 | Chetry et al. | |

FOREIGN PATENT DOCUMENTS

| | | | |
|---|---|---|---|
| WO | 2010148405 | A2 | 12/2010 |
| WO | 2017061638 | A1 | 4/2017 |

OTHER PUBLICATIONS

PCT International Search Report and Written Opinion, PCT/US2024/039159, Nov. 6, 2024, 14 pages.

* cited by examiner

ANCHOR STRUCTURE

FIELD

This invention relates to semiconductor device manufacture and, in particular to methods of manufacture of Micro-Electro-Mechanical Systems (MEMS) devices.

BACKGROUND

Micro-Electro-Mechanical Systems (MEMS) devices are used in a wide variety of applications and electronic devices. Sensors that measure physical parameters can be implemented in a MEMS device. Typically, the physical parameter measured by the MEMS device is converted to an equivalent electrical signal to interface with electronic circuitry to utilize the quantitative measurement. MEMS devices are three dimensional physical structures formed in a semiconductor substrate that are designed to convert measured physical parameters to equivalent electrical signals.

Typically, a MEMS device has a moving component. The moving component moves in relation to a static component of the system such as the semiconductor substrate in which the MEMS device is formed. A MEMS device utilizes one or more anchors to support a moving element. The one or more anchors attach to the semiconductor substrate. The moving element is typically suspended from the semiconductor substrate and is configured to move in relation to the semiconductor substrate. Movement of the moving element corresponds to the parameter being measured such as acceleration, rotation, angular velocity, humidity, or pressure.

The one or more anchors must be strong enough to support the moving element. As mentioned, the base of the one or more anchors is attached to the semiconductor substrate. Moreover, the anchor has to withstand the stress exerted by the moving element under the forces applied by the parameter being measured. As is often the case, the manufacture of the anchor can be very complex thereby increasing the cost of the MEMS device. Increasing the strength of the anchor can increase the complexity of the design or the area required for the anchor thereby increasing the cost and size of the MEMS device. If the anchor is not robust, mechanical failure of the MEMS device can occur. Thus, it would be of great benefit if an anchor of a MEMS device could be manufactured that comprises a small footprint while increasing the strength of the anchor under stress.

BRIEF DESCRIPTION OF THE DRAWINGS

Various features of the system are set forth with particularity in the appended claims. The embodiments herein, can be understood by reference to the following description, taken in conjunction with the accompanying drawings, in which:

DETAILED DESCRIPTION

Figure 1:
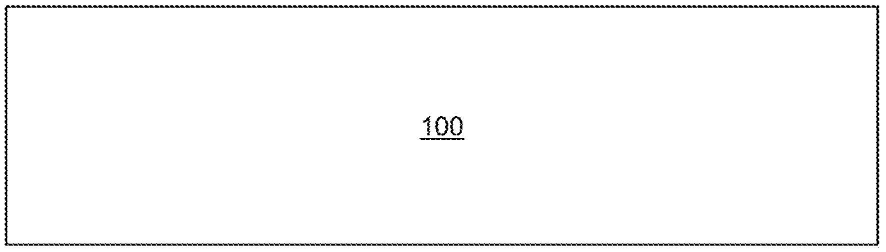
FIG. 1 is an illustration of a semiconductor substrate in accordance with an example embodiment.

The following description of embodiment(s) is merely illustrative in nature and is in no way intended to limit the invention, its application, or uses.

For simplicity and clarity of the illustration(s), elements in the figures are not necessarily to scale, are only schematic, are non-limiting, and the same reference numbers in different figures denote the same elements, unless stated otherwise. Additionally, descriptions and details of well-known steps and elements are omitted for simplicity of the description. Notice that once an item is defined in one figure, it may not be discussed or further defined in the following figures.

The terms "first," "second," "third" and the like in the Claims or/and in the Detailed Description are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Processes, techniques, apparatus, and materials as known by one of ordinary skill in the art may not be discussed in detail but are intended to be part of the enabling description where appropriate.

While the specification concludes with claims defining the features of the invention that are regarded as novel, it is believed that the invention will be better understood from a consideration of the following description in conjunction with the drawing figures, in which like reference numerals are carried forward.

The current invention is described with an example embodiment of a semiconductor device formed in a semiconductor substrate. In the example embodiment, a single crystalline silicon wafer is used as the semiconductor substrate to describe the formation of a semiconductor device encompassing the current invention. Other semiconductor substrates such as SOI (Silicon on Insulator), GaAs (Gallium Arsenide), GaN (Gallium Nitride), SiC (Silicon Carbide), InP (Indium Phosphide) may also be used for the implementation of the current invention. Semiconductor devices such as MEMS (Micro-Electro-Mechanical Systems) sensors and actuators, microfluidic devices, optical devices, magnetic devices among other devices may be formed in the semiconductor substrate.

FIG. 1 is an illustration of a semiconductor substrate 100 used for the implementation of the semiconductor device in accordance with an example embodiment. In the example embodiment, semiconductor substrate 100 is a monocrystalline or single crystal silicon wafer. In the example embodiment, monocrystalline silicon wafer may have a doping of 0.001 ohm-cm to 10,000 ohm-cm and may be n-type doped or p-type doped and may be doped by dopants such as arsenic, antimony, phosphorus, or boron to name but a few. In the example embodiment, substrate 100 is doped with n-type dopant with phosphorus.

Figure 2:
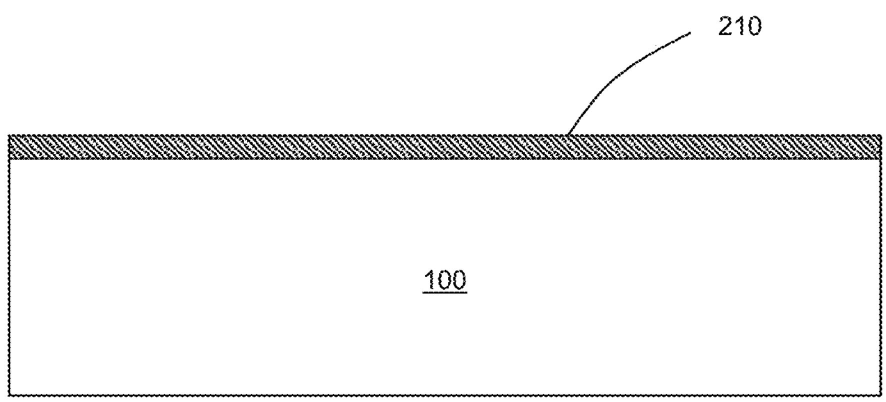
FIG. 2 is an illustration of an intermediate layer overlying the semiconductor substrate in accordance with an example embodiment.

FIG. 2 is an illustration of an intermediate layer 210 overlying semiconductor substrate 100 in accordance with an example embodiment. Intermediate layer 210 comprises a single crystal or monocrystalline layer and is grown overlying semiconductor substrate 100. Intermediate layer 210 is grown such that it is relaxed and has no strain or very low strain. Intermediate layer 210 is grown overlying semiconductor substrate 100 by epitaxial growth in a reactor. The conditions of the epitaxial growth are controlled such that intermediate layer 210 is relaxed by varying the thickness, gas precursors, temperatures, ramp rate, flow rates, and other process conditions. Intermediate layer 210 may be relaxed by modulating the growth conditions such that the strain in intermediate layer 210 is relieved by the formation of dislocations by breaking of bonds due to the mismatch of the lattice parameters between the atoms of semiconductor substrate 100 and intermediate layer 210 by growing intermediate layer 210 beyond the critical thickness of the particular growth conditions of temperature and other process parameters. The relaxation of strain may be due to misfit dislocations and threading dislocations and the density of these defects may be in the range of $10^9/cm^2$. In another embodiment, the strain in intermediate layer 210 may be relieved by introduction of another atom with a different lattice constant to semiconductor substrate 100 in addition to atoms of one kind used in the single crystalline structure of intermediate layer 210. Intermediate layer 210 may comprise epitaxial growth of multiple layers of single crystal semiconductor material with each layer having different growth rates, temperatures, gas precursors, flow rates or changes in other process parameters. Intermediate layer 210 comprising a composite layer formed by growth of multiple layers is relaxed by growth of each layer of the composite beyond the critical thickness. In one embodiment, intermediate layer 210 may be grown by multiple sub-layers of intermediate layer 210 with thermal anneal processes between subsequent epitaxial steps such that the internal strain is relieved by formation of dislocations. Each sub-layer is grown having a thickness beyond the critical thickness such that the subsequent grown sub-layer is grown under reduced internal strain. Intermediate layer 210 may be doped during the epitaxial growth process to modulate the properties of intermediate layer 210 for subsequent processes. Intermediate layer may be doped by introducing dopants during the epitaxial growth process and may be n-type or p-type doped. The thickness of intermediate layer 210 may be in the range of 0.5 microns to 10 microns in thickness and is relaxed with zero strain or very low strain by growing the thickness beyond the critical thickness.

In the example embodiment, intermediate layer 210 comprises single crystal silicon germanium overlying semiconductor substrate 100 comprising single crystal silicon. In the example embodiment, intermediate layer 210 is formed by growing single crystal silicon germanium epitaxially overlying a top surface of single crystal silicon semiconductor substrate 100. The composition of Silicon Germanium (SiGe) may be represented by the formula $Si_{(1-x)}Ge_x$, where "x" represents the mole fraction as a percentage of Germanium (Ge) in the Silicon Germanium (SiGe) alloy. The mole fraction percentage of Ge, represented by "x" may be between 1% to 100%. The fraction of Ge in the $Si_{(1-x)}Ge_x$ alloy may be modulated according to the particular application of intermediate layer 210 in the formation of a semiconductor device. In one embodiment, intermediate layer 210 comprises 30% of Ge in the SiGe alloy.

In the example embodiment, intermediate layer 210 comprising single crystal SiGe is epitaxially grown overlying semiconductor substrate 100 comprising single crystal silicon such that the thickness of SiGe is relaxed with zero strain or very low strain. The composition of SiGe layer may be modulated for different application specific requirements by relaxing intermediate layer 210 by growing it beyond the critical thickness to form dislocations such as misfit dislocations or threading dislocations or a combination of misfit/threading dislocations. The critical thickness for the particular composition of SiGe layer is the thickness below which intermediate layer 210 is strained with limited dislocations and above the critical thickness, the residual strain is relieved by formation of density of dislocations by breaking of bonds in the single crystalline lattice structure leading to a relaxed layer with zero strain or very low strain. The critical thickness of intermediate layer 210 is determined by the composition, growth temperature, gas precursors, flow rates etc., among other factors. In the example embodiment, intermediate layer 210 comprising SiGe may be grown by epitaxial growth of one or more layers of SiGe and by growing each layer beyond the corresponding critical thickness by relaxing the strain by formation of dislocations. In the example embodiment, intermediate layer 210 may comprise 30% Ge in a SiGe layer that is strain free by formation of a density of dislocations to relieve the residual strain.

In some embodiments, the composition of intermediate layer 210 may vary across the thickness of intermediate layer 210. In some embodiments, the composition of intermediate layer 210 may vary in a linear manner while in other embodiments, the composition of intermediate layer 210 may vary in a step wise manner.

Figure 3:
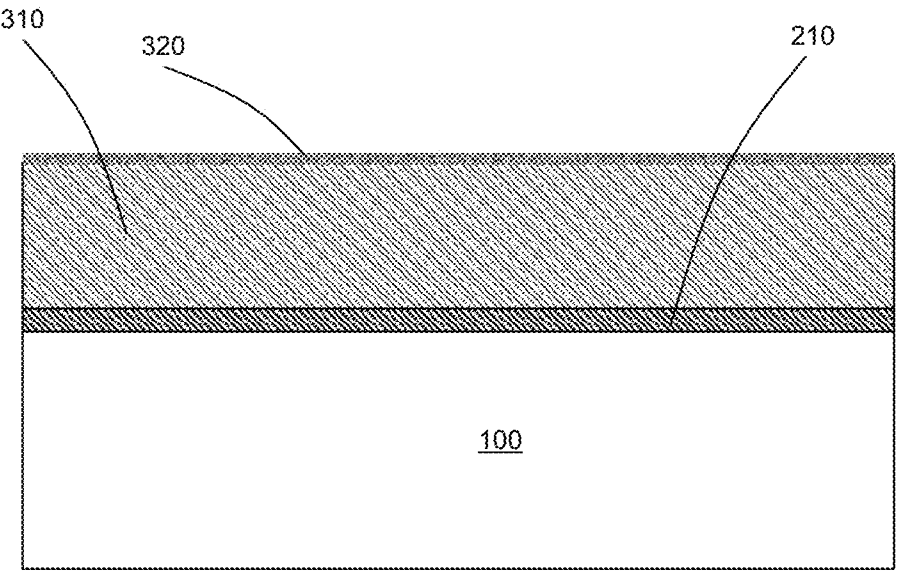
FIG. 3 is an illustration of a device layer overlying the intermediate layer in accordance with an example embodiment.

FIG. 3 is an illustration of a device layer 310 overlying intermediate layer 210 in accordance with an example embodiment. Device layer 310 comprises a single crystal semiconductor material and is epitaxially grown overlying the surface of intermediate layer 210.

In the example embodiment, device layer 310 comprises single crystal silicon and is grown such that it is relaxed with zero strain or very low residual strain. As described above, intermediate layer 210 is a single crystalline or monocrystalline layer and is relaxed with zero or very low strain by the growth of the layer to a thickness beyond the critical thickness with formation of a density of dislocations to relieve the strain caused by the mismatch of the lattice constants in intermediate layer 210 and semiconductor substrate 100. Since device layer 310 is epitaxially grown above intermediate layer 210, it is also grown such that it is relaxed with zero or very low strain by the growth of device layer 310 beyond the critical thickness due to the choice of the growth conditions of device layer 310. By growing device layer 310 above a relaxed layer comprising intermediate layer 210 with a density of dislocations to relieve the residual strain, the strain of device layer 310 is similarly relieved by formation of dislocations by growing device layer 310 beyond the critical thickness.

In the example embodiment, device layer 310 comprising single crystal silicon is grown in an epitaxial reactor with precursor gases such as DCS (Dichlorosilane), TCS (Trichlorosilane), $SiH_4$ (Silane) among other precursor gases and at a temperature between 400-1200 ° C. to enable the formation of single crystal silicon layer overlying the relaxed surface of intermediate layer 210. The gas flow rates, temperatures and thickness of device layer 310 may be modulated to grow the film thickness beyond the critical thickness and is accompanied by the formation of dislocations to form a relaxed device layer 310 with zero or very low strain.

Device layer 310 may be grown as an undoped or doped layer depending on the application. In one embodiment, device layer 310 may be formed as a single crystal silicon layer which is doped. The doping of device layer 310 is achieved by flowing dopant gases such as arsine, phosphine, diborane along with precursor gases such as DCS and TCS to dope device layer 310 n-type or p-type depending on the doping type required for the formation of the semiconductor device. The sheet resistance of the doped layer forming device layer 310 may be in the range of (0.001-10,000) ohm-cm and may be n-type or p-type.

The thickness of device layer 310 with zero or very low strain due to density of dislocations may be in the range of 1-200 microns and may be formed in one or multiple epitaxial deposition steps such that the critical thickness of each sub-layer of device layer 310 is exceeded for the particular growth conditions. The number of steps of epitaxial growth may vary from one to 100 steps and each epitaxial growth step produces a strain free layer due to formation of dislocations. In some embodiments, intermediate annealing steps may be used between deposition steps to reduce residual strain in addition to formation of dislocations. The temperature and time of each deposition and annealing step may be varied to reduce the residual strain and also the surface roughness. Since dislocations are intentionally created in device layer 310 to relieve the residual strain, the misfit and threading dislocations that are created contribute to a surface roughness 320 on the surface of device layer 310, as shown in FIG. 3. Surface roughness 320 on the surface of device layer 310 are due to the density of dislocations produced by the strain relaxation leading to zero or very low strain and has an average roughness of between (2-100) nm depending on the starting surface roughness of intermediate layer 210 and the growth conditions of device layer 310.

Figure 4:
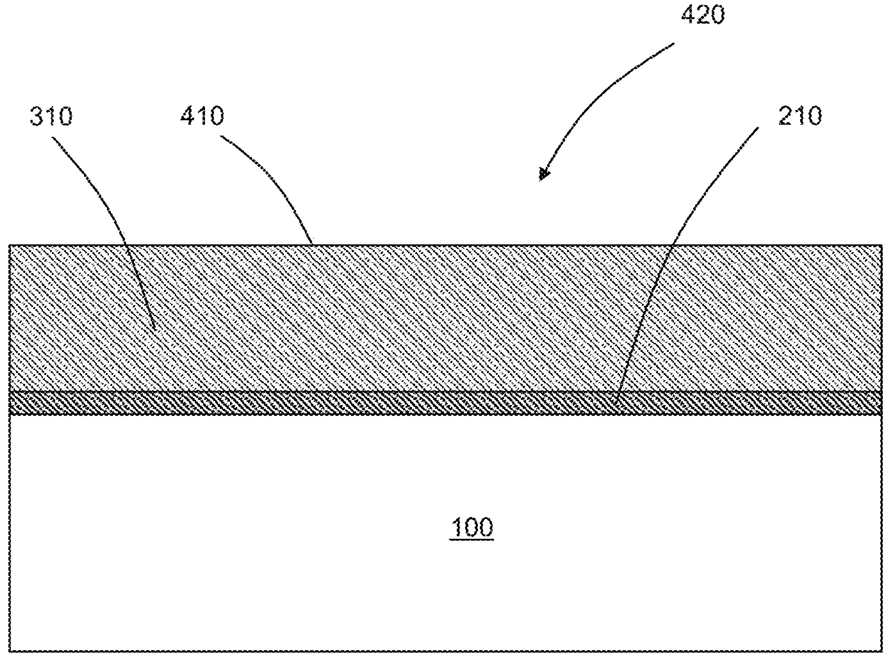
FIG. 4 is an illustration of a polished surface of the device layer overlying the intermediate layer in accordance with an example embodiment.

FIG. 4 is an illustration of device layer 310 with the layer of surface roughness 320 removed by a kiss polish using Chemical Mechanical Polishing (CMP). In the example embodiment, device layer 310 is comprised of single crystal silicon and layer of surface roughness 320 of FIG. 3 having an average roughness of (10-100) nanometers. A CMP step is utilized to remove the surface roughness to an average surface roughness below 10 Angstroms resulting in a planarized surface 410. This surface finish of device layer 310 comprising single crystal silicon in the example embodiment has an optical finish suitable for lithography processes as described in subsequent steps for the formation of a semiconductor device. In FIG. 4, planarized surface 410 is the result of the polishing CMP step described above applied to surface of device layer 310 after the epitaxial growth process.

The composite substrate formed by the growth of single crystal intermediate layer 210 overlying semiconductor substrate 100 and growth of single crystal device layer 310 overlying intermediate layer 210 forms an engineered substrate 420 as shown in FIG. 4. In engineered substrate 420, both intermediate layer 210 and device layer 310 are single crystal and are relaxed with zero or very low strain by formation of a density of dislocations by growing each layer beyond the corresponding critical thickness. In the example embodiment, engineered substrate 420 comprises semiconductor substrate 100 of doped single crystal silicon, intermediate layer 210 that comprises single crystal silicon germanium and device layer 310 that comprises doped single crystal silicon having planarized surface 410. Intermediate layer 210 and device layer 310 are relaxed as disclosed herein above.

Figure 5:
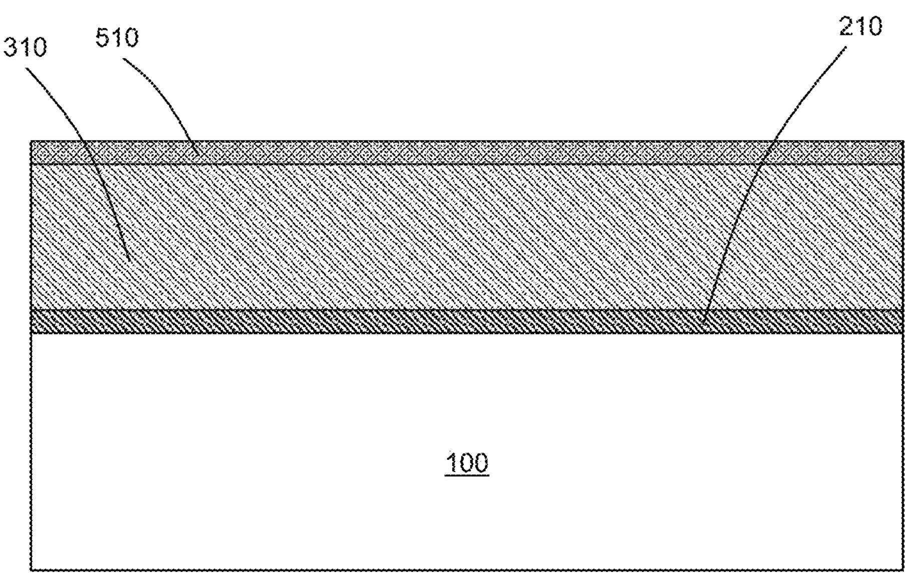
FIG. 5 is an illustration of a mask layer overlying the polished surface of the device layer in accordance with an example embodiment.

FIG. 5 is an illustration of a mask layer 510 formed above the polished surface of device layer 310 in accordance with an example embodiment. Mask layer 510 may be formed by deposition of a dielectric or conductive layer to enable the transfer of a pattern to device layer 310 using the techniques of lithography and etching, as well known to those skilled in the art, for the formation of semiconductor devices. Mask layer 510 may be formed using growth process or by deposition processes using CVD (Chemical Vapor Deposition), ALD (Atomic Layer Deposition) and other deposition techniques. Materials used for mask layer 510 may comprise silicon oxide, silicon nitride, silicon carbide, aluminum oxide, aluminum nitride, PSG (Phosphosilicate Glass), BSG (Boron Silicon Glass), BPSG (BoronPhosphoSilicate Glass), Silicon oxynitride, among other materials. The thickness of mask layer 510 may be in the range of 1000 A to 5 microns and is determined by the requirements of fabrication process steps subsequently described. In the example embodiment, mask layer 510 comprises a silicon oxide layer that is deposited using LPCVD (Low Pressure Chemical Vapor Deposition) and the thickness is in the range of 0.5 to 1 micron.

Figure 6:
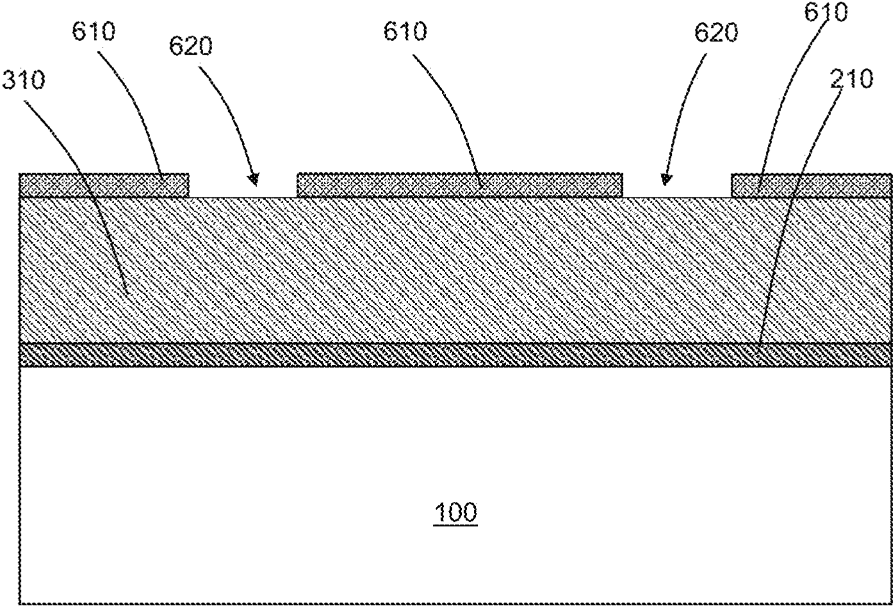
FIG. 6 is an illustration of the patterned mask layer in accordance with an example embodiment.

FIG. 6 is an illustration of mask layer 510 patterned in accordance with the example embodiment. Mask layer 510 is patterned using the techniques of lithography and etching as used in the fabrication of semiconductor devices. In the example embodiment, a mask or reticle is used to transfer a pattern to the surface of the silicon oxide comprising mask layer 510. The mask pattern transfer is achieved using a photosensitive layer called photoresist using a lithography tool such as stepper, scanner, contact aligner, projection aligner, proximity aligner and other tools used for lithography pattern transfer. Both positive and negative photoresist may be used in the lithographic pattern transfer. The transfer of the photoresist is used to remove portions of mask layer 510. Wet chemical etching or dry chemical etching using RIE (Reactive Ion Etching), or a combination of dry and wet chemical etching may be used to pattern mask layer 510. In the example embodiment, mask layer 510 comprising silicon oxide is patterned with a positive photoresist using RIE (Reactive Ion Etching) with fluorine chemistry such as $SF_6$ to form regions of patterned mask layer 610 and openings 620. Openings 620 in mask layer 510 are regions in mask layer 510 where RIE is utilized to expose regions of device layer 310 comprising planarized surface 410 of single crystal silicon device layer 310. The width of openings 620 may be in the range of 1 micron to 10 microns and is determined by the requirement of the design of the semiconductor device formed in subsequent steps.

Figure 7:
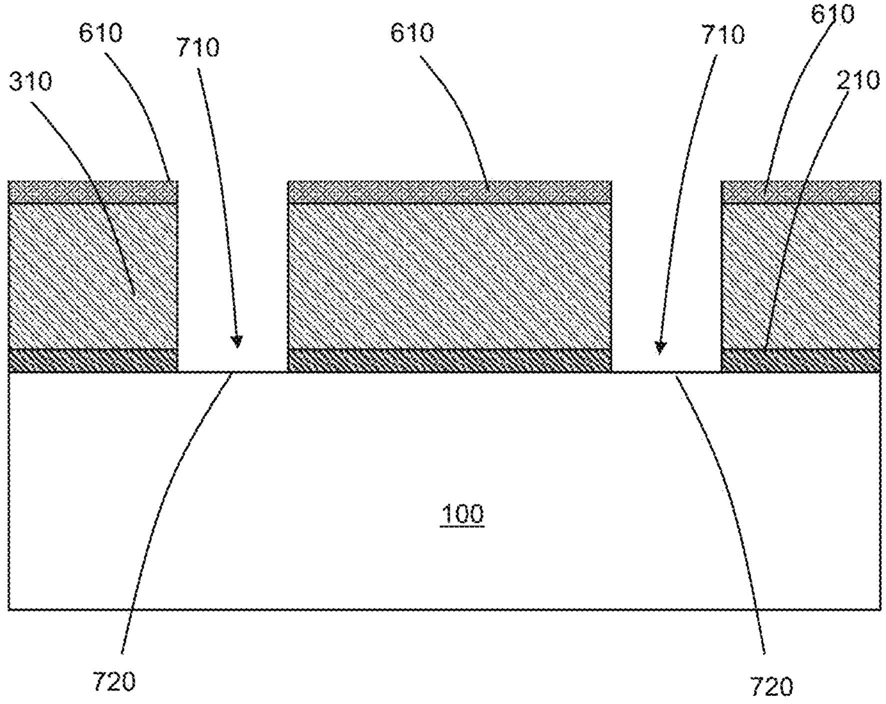
FIG. 7 is an illustration of openings formed in the device layer and intermediate layer in accordance with an example embodiment.

FIG. 7 is an illustration of openings 710 formed in device layer 310 and intermediate layer 210 in accordance with an example embodiment. Openings 710 formed in device layer 310 and intermediate layer 210 are patterned using high aspect ratio etching techniques such as DRIE (Deep Reactive Ion Etching). Openings 710 in device layer 310 and intermediate layer 210 may be achieved in one etching process or two separate etching processes using different etching methods and chemistries, depending on the material used for formation of device layer 310 and intermediate layer 210.

In the example embodiment, exposed regions of device layer 310 by patterned mask layer 610 are used to etch high aspect ratio trenches in device layer 310 comprising single crystal silicon by using the BOSCH DRIE (Deep Reactive Ion Etching) process using $SF_6$ chemistry and alternate cycles of etch using $SF_6$ and passivation using a polymer to form high aspect ratio trenches. In the example embodiment, intermediate layer 210 comprising SiGe is then patterned using the same BOSCH DRIE process to remove portions of intermediate layer 210 to form exposed regions 720 of semiconductor substrate 100 comprising silicon crystal silicon. In the example embodiment, exposed regions 720 at the bottom of openings 710 is the surface of semiconductor substrate 100 comprising silicon crystal. In other embodiments, exposed regions 720 may be recessed into semiconductor substrate 100. In one embodiment, the depth of the recess in semiconductor substrate 100 in exposed regions 720 may be in the range of (0.5-5) microns.

Figure 8:
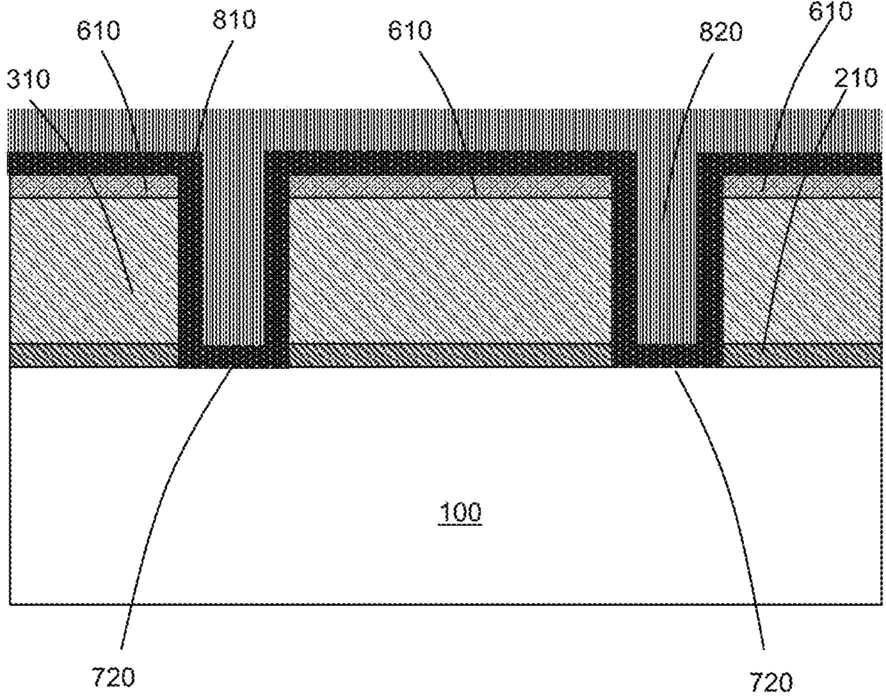
FIG. 8 is an illustration of a refill of the openings of FIG. 7 formed in the device layer and intermediate layer in accordance with an example embodiment.

FIG. 8 is an illustration of a refill of openings 710 of FIG. 7 by deposition of layers in accordance with an example embodiment. In the example embodiment, openings 710 of FIG. 7 formed in device layer 310 and intermediate layer 210 with exposed regions 720 on or below surface of semiconductor substrate 100 are refilled by deposition of one or more layers of semiconductor material. The deposition method used for the refill of openings 710 of FIG. 7 may comprise CVD (Chemical Vapor Deposition), ALD (Atomic Layer Deposition), reactive growth such as oxidation and other deposition methods. The deposition methods for the refill of openings 710 of FIG. 7 are preferably conformal such that openings 710 of FIG. 7 are refilled completely or refilled with small internal voids. The refill of openings 710 may be achieved with one or multiple layers depending on the choice of materials and the dimensions of openings 710 of FIG. 7. The refill process used for openings 710 of FIG. 7 enables one or more refill layers to be in contact with exposed regions 720 of semiconductor substrate 100 in the bottom of openings 710.

In the example embodiment, openings 710 of FIG. 7 are etched through device layer 310 and comprising single crystal silicon and is etched through intermediate layer 210 comprising Silicon Germanium. In the example, embodiment, openings 710 of FIG. 7 are refilled with two refill layers. In the example embodiment, the first refill layer comprises a dielectric layer 810 and the second refill layer comprises a refill layer 820. In the example embodiment, dielectric layer 810 comprises LPCVD silicon nitride which is deposited conformally over the surface of patterned mask layer 610, sidewalls of openings 710 of FIG. 7 in device layer 310 and intermediate layer 210 and exposed regions 720 on surface of semiconductor substrate 100. In the example embodiment, dielectric layer 810 comprising LPCVD silicon nitride is low stress, silicon rich silicon nitride and the thickness is between (0.5-1.5) microns.

In the example embodiment, refill layer 820 used as the second refill layer used for refilling openings 710 of FIG. 7 comprises LPCVD polycrystalline silicon or polysilicon. Refill layer 820 comprising LPCVD polycrystalline silicon conformally deposits over a surface of the first refill layer comprising dielectric layer 810 of silicon nitride. The polycrystalline silicon used as refill layer 820 may be undoped or doped and may have a thickness of (0.5-5) microns. The thickness of refill layer 820 is dependent on the width of openings 710 of FIG. 7 and thickness of dielectric layer 810 such that openings 710 of FIG. 7 are completely refilled. In another embodiment, openings 710 of FIG. 7 are completely refilled by deposition of a single refill layer comprising dielectric layer 810. In another embodiment, openings 710 of FIG. 7 may be completely refilled by deposition of refill layer 820 comprising a second LPCVD silicon nitride layer over first dielectric layer 810. In another embodiment, multiple refill layers may be used to completely refill openings 710 of FIG. 7.

Figure 9:
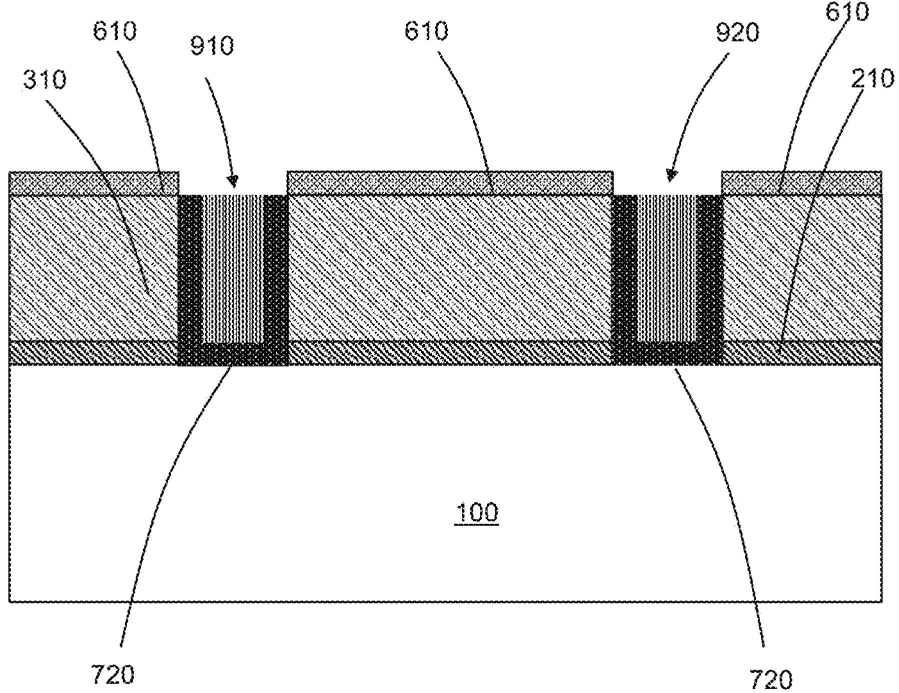
FIG. 9 is an illustration showing the removal of the refill layers overlying the surface of the patterned mask layer in accordance with an example embodiment.

FIG. 9 is an illustration showing the removal of refill layer 820 of FIG. 8 and dielectric layer 810 of FIG. 8 over a surface of patterned mask layer 610 in accordance with an example embodiment. In the example embodiment, refill layer 820 comprising LPCVD polysilicon and dielectric layer 810 comprising LPCVD silicon nitride overlying patterned mask layer 610 regions comprising silicon dioxide are removed using a blanket etch using RIE with fluorine chemistry such as $SF_6$, $CF_4$, $CHF_3$ and other fluorine chemistries used for etching polysilicon and silicon nitride. The blanket RIE etch back of refill layer 820 and dielectric layer 810 is performed such that the residual layers of refill layer 820 and dielectric layer 810 are substantially planar with surface of device layer 310 or slightly recessed below surface of patterned mask layer 610. The blanket etch back of refill layer 820 and dielectric layer 810 forms anchor structures 910 and 920 comprising dielectric layer 810 and refill layer 820 in contact with surface of semiconductor substrate 100 through exposed regions 720.

Figure 10:
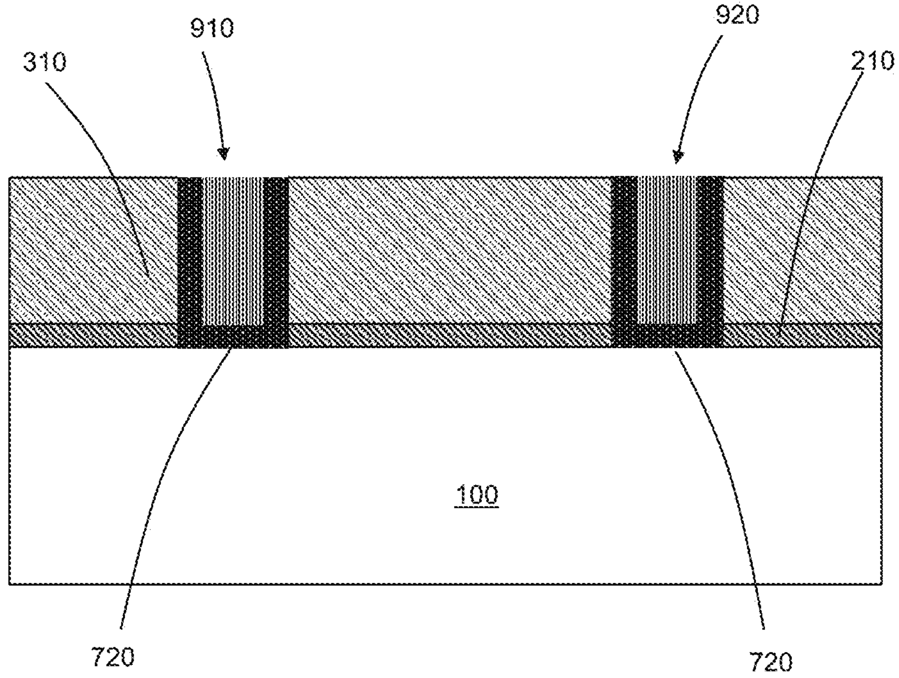
FIG. 10 is an illustration of the removal of the patterned mask layer of FIG. 9 from the polished surface of the device layer in accordance with an example embodiment.

FIG. 10 is an illustration of the removal of patterned mask layer 610 of FIG. 9 in accordance with an example embodiment. After the removal of portions of refill layer 820 of FIG. 8 and dielectric layer 810 of FIG. 8 overlying surface of patterned mask layer 610, the remaining regions of patterned mask layer 610 of FIG. 9 are removed using wet or dry etching methods. In the example embodiment, patterned mask layer 610 comprising silicon dioxide is removed using wet chemistry such as HF (hydrofluoric acid), dilute HF, BHF (Buffered hydrofluoric acid) and other suitable chemistries. In another embodiment, CMP (Chemical Mechanical Polishing) may be used to remove refill layer 820 of FIG. 8, dielectric layer 810 of FIG. 8 and regions of patterned mask layer 610 of FIG. 9 to expose surface of device layer 310 and form anchor structures 910 and 920.

Figure 11:
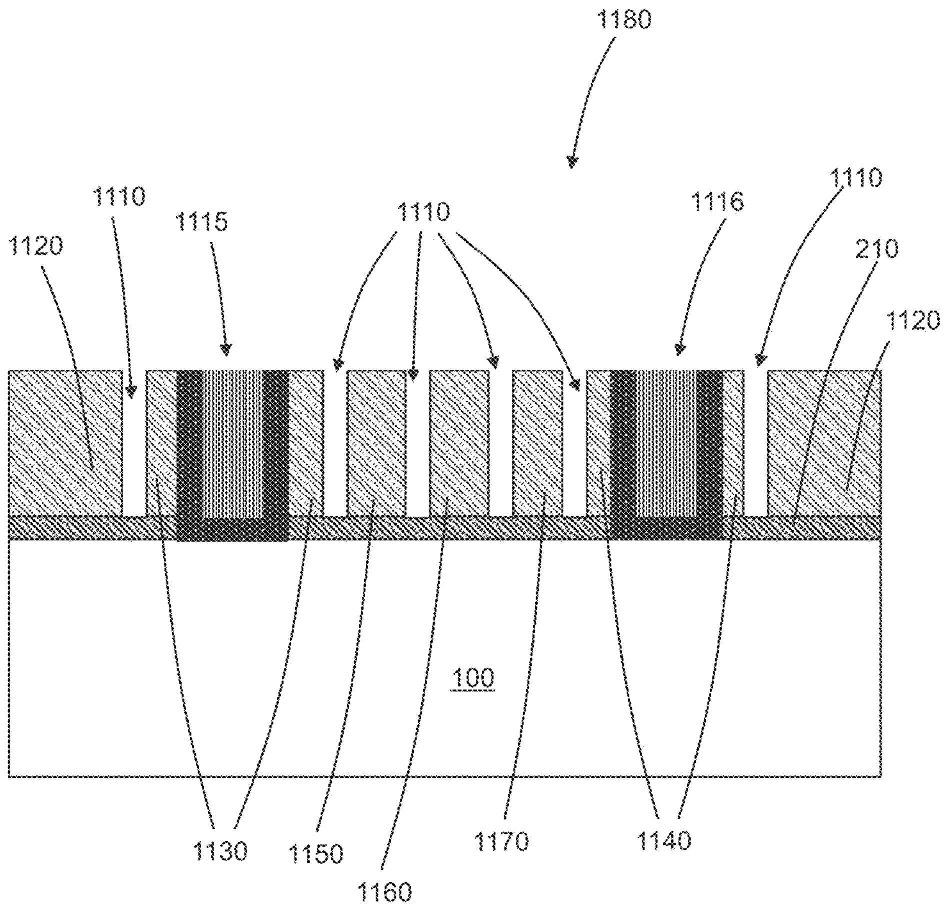
FIG. 11 is an illustration of openings formed in the device layer in accordance with an example embodiment.

FIG. 11 is an illustration showing openings 1110 formed in device layer 310 in accordance with an example embodiment. Openings 1110 are formed in device layer 310 to enable formation of a semiconductor device 1180. In the example embodiment, semiconductor device 1180 comprises a MEMS (Micro-Electro-Mechanical Systems) device formed using engineered substrate 420 described in FIG. 4. In the example embodiment, openings 1110 are formed using the techniques of lithography and etch processes as well known to those skilled in the art. The pattern of openings 1110 are transferred to the surface of a photoresist that is selectively exposed to UV (ultraviolet) light using a lithography tool such as a stepper or aligner using a mask or reticle. The transferred pattern in the photoresist is then used to selectively etch trenches in device layer 310 to expose portions of intermediate layer 210 at the bottom of openings 1110. In the example embodiment, DRIE (Deep Reactive Ion Etching) is used to form openings 1110 forming an array of trenches with high aspect ratio, where the trench openings are smaller than the height of the trenches. The aspect ratio (height to width) of openings 1110 may be in the range of 5:1 to 60:1. In the example embodiment, the aspect ratio of openings 1110 is in the range of 10:1. In the example embodiment, the formation of openings 1110 enables the formation of patterned device layer 1120, 1130, 1140, 1150, 1160, and 1170. Different combinations of the array of patterned device layer (1120-1170) may be used in the formation of different semiconductor devices. In the example embodiment, semiconductor device 1180 is a MEMS device and more specifically an accelerometer sensor or accelerometer that detects acceleration due to inertial force.

In FIG. 11, openings 1110 enable formation of anchors 1115 and 1116 that are attached to semiconductor substrate 100. Using openings 1110, anchor 1115 is formed by patterned device layer 1130 attached to anchor structure 910 of FIG. 10 comprising dielectric layer 810 and refill layer 820. Anchor 1115 as disclosed is attached to the surface of semiconductor substrate 100. In the example embodiment, patterned device layer 1130 comprises single crystal silicon, and semiconductor substrate 100 comprises single crystal silicon. Similarly, using openings 1110, anchor 1116 is formed by patterned device layer 1140 attached to anchor structure 920 of FIG. 10 comprising dielectric layer 810 and refill layer 820 and attached to surface of semiconductor substrate 100. In the example embodiment, patterned device layer 1140 comprises single crystal silicon, and semiconductor substrate 100 comprises single crystal silicon.

Figure 12:
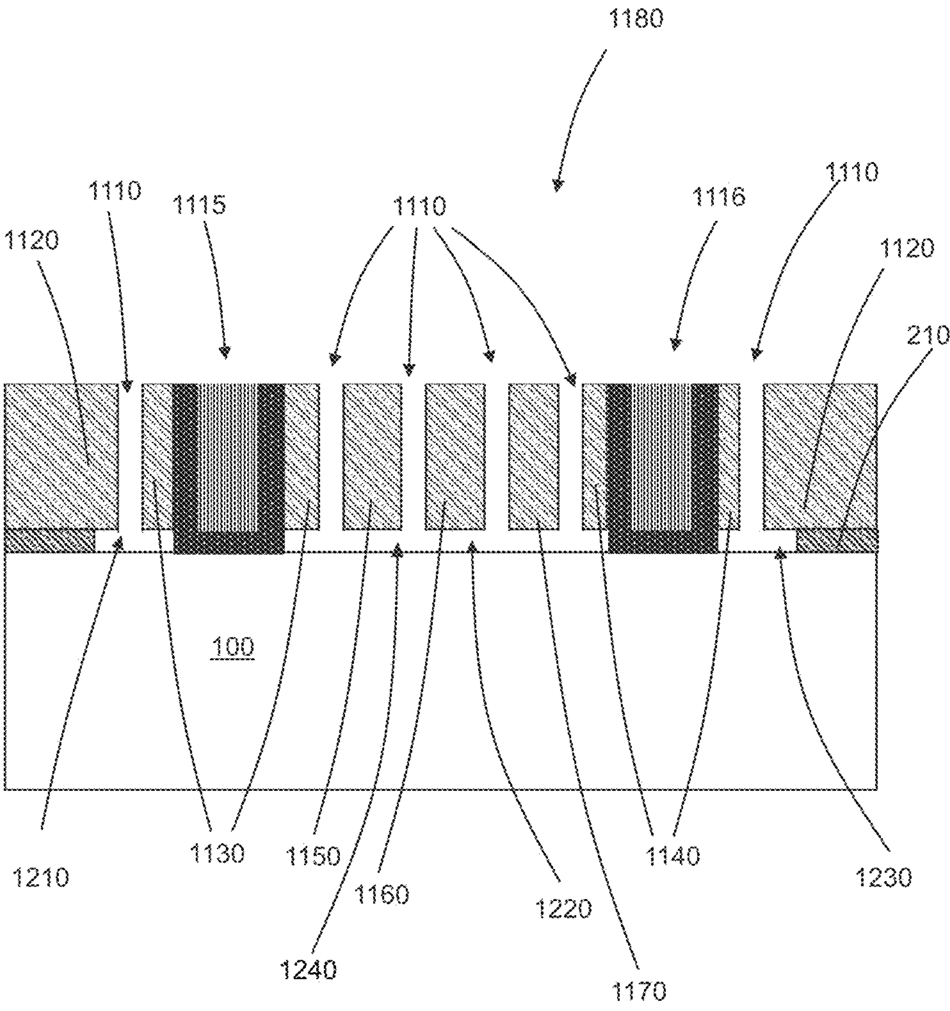
FIG. 12 is an illustration of the formation of a semiconductor device in accordance with an example embodiment.

FIG. 12 is an illustration of semiconductor device 1180 formed in accordance with an example embodiment. In the example embodiment, semiconductor device 1180 is a MEMS device and more specifically an accelerometer sensor that detects acceleration due to inertial force. In FIG. 12, openings 1110 formed in device layer 310 are used to selectively remove portions of intermediate layer 210 while selectively being attached to semiconductor substrate 100 with anchors 1115 and 1116.

In the example embodiment, openings 1110 in device layer 310 comprising single crystal silicon are used to introduce etchants to selectively remove portions of intermediate layer 210 comprising single crystal silicon germanium to form undercut regions 1210, 1220 and 1230 below device layer 310 by removing portions of intermediate layer 210. The etchant that is used to remove portions of intermediate layer 210 is highly selective to device layer 310 and semiconductor substrate 100 and the etching process may use wet, dry, vapor or gaseous etchant. In the example embodiment, vapor hydrochloric acid (HCl) is used to selectively etch portions of intermediate layer 210 comprising single crystal SiGe through openings 1110 in device layer 310 comprising single crystal silicon forming undercut regions 1210, 1220 and 1230 forming a gap between portions of patterned device layer (1120-1170) and semiconductor substrate 100 comprising single crystal silicon. Vapor HCl may be diluted with a carrier gas such as hydrogen, nitrogen, argon among carrier gases and the etching pressure may be in vacuum or in atmospheric pressure. The temperature at which the etching of intermediate layer 210 is carried out may be in the range of 250-1100° C. and the flow rate of the gases may be modified to achieve the desired etch rate and selectivity.

In FIG. 12, anchor 1115 is physically attached to surface of semiconductor substrate 100 and electrically isolated from semiconductor substrate 100. In one embodiment, this is achieved by anchor structure 910 of FIG. 10 comprising portion of dielectric layer 810 and refill layer 820 and patterned device layer 1130. A moving mass 1240 of the accelerometer comprising patterned device layer 1140, 1150, 1160 and 1170 is formed with anchor 1116 such that it is physically attached to surface of semiconductor substrate 100 and electrically isolated from semiconductor substrate 100 by anchor structure 920 of FIG. 10 comprising portion of dielectric layer 810 and refill layer 820 and patterned device layer 1140. Moving mass 1240 is free to move under the stimulus of an inertial force such as acceleration since the underlying portion of intermediate layer 210 is removed by formation of undercut region 1210, 1220 and 1230. Different techniques for detection of the motion of moving mass may be used to detect the inertial stimulus. Transduction methods such as capacitance detection, piezoelectric, piezoresistive, resonant frequency, optical among other transduction techniques may be used for the accelerometer. In the example embodiment, semiconductor device 1180 comprises an accelerometer that uses capacitive transduction to detect the input acceleration. Moving mass 1240 comprises anchor 1116 attached to a suspension spring comprising portion of patterned device layer 1170. The suspension spring enables the movement of moving mass 1240 and is coupled to a proof mass comprising portion of patterned device layer 1160. The proof mass comprising portion of patterned device layer 1160 is coupled to an array of electrodes represented by portion of patterned device layer 1150. When the input acceleration causes the movement of moving mass 1240, the gap between electrode represented by patterned device layer 1150 and portion of patterned device layer 1130 of anchor 1115 changes and causes a change in the capacitance. The change in capacitance due to the change in the gap represents the input acceleration and is further converted to the electrical domain to produce an output signal that is representative of the input acceleration.

Figure 13:
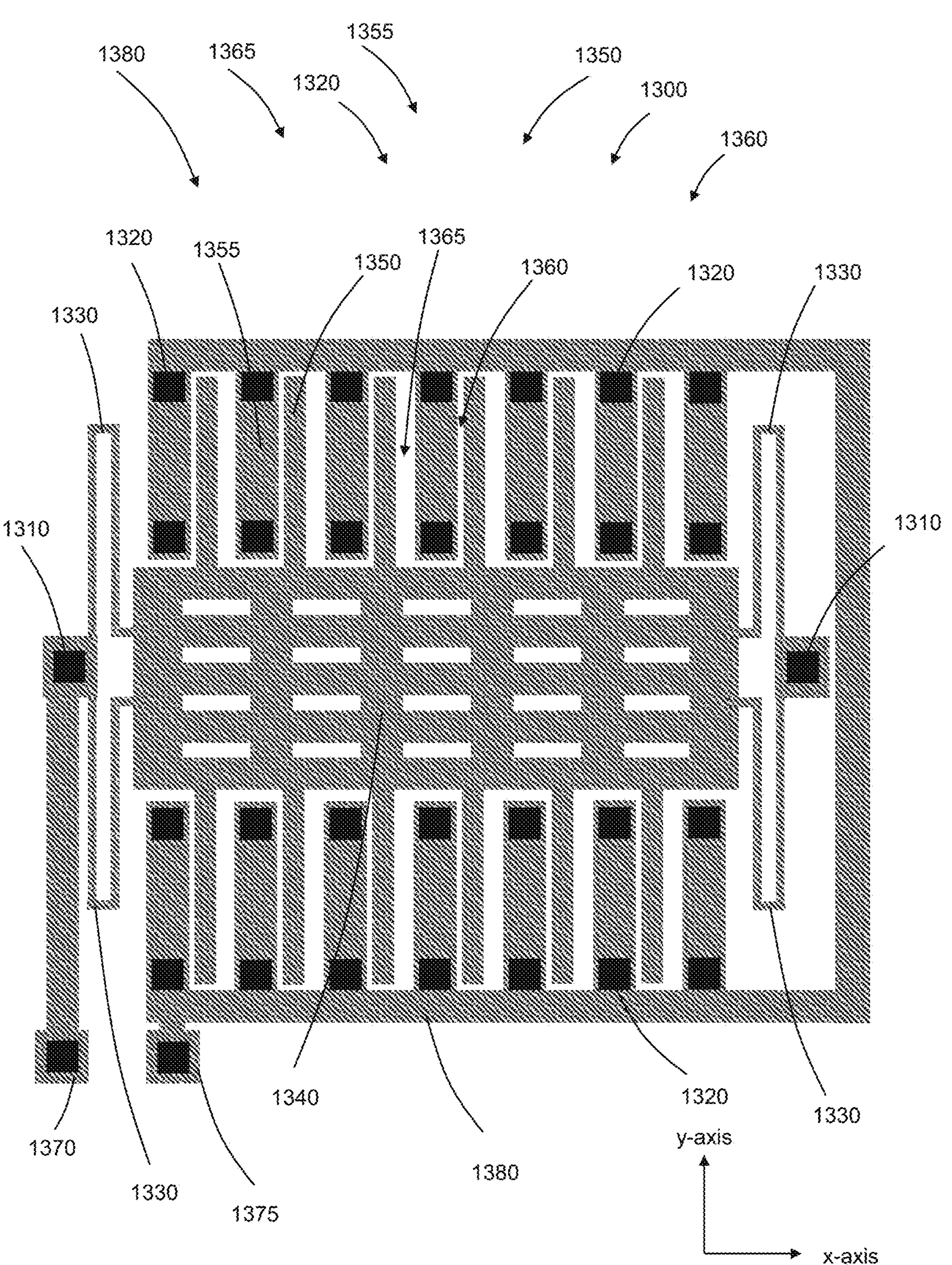
FIG. 13 is an illustration of a MEMS device formed in accordance with an example embodiment.

FIG. 13 is an illustration of a MEMS device 1300 formed in accordance with an example embodiment. In the example embodiment, MEMS device 1300 is the top view of a lateral accelerometer capable of sensing lateral acceleration in the plane of the device in accordance with the example embodiment. Note that a single structure may be identified on the figure directly, but it can be replicated multiple times and is understood to be labeled accordingly. In FIG. 13, MEMS device 1300 is a lateral accelerometer with capacitive sensing that comprises a moving element and a static element formed in device layer 1380 of an engineered substrate 420 of FIG. 4. In the example embodiment, the moving element comprises a proof mass 1340 coupled to a spring suspension 1330 which is coupled to an anchor 1310. Moving electrodes 1350 are coupled to proof mass 1340, spring suspension 1330, and anchor 1310 to form the moving mass of the lateral accelerometer of MEMS device 1300 of the example embodiment. The lateral accelerometer also comprises a static element comprising an array of static electrodes 1355 supported by an array of anchors 1320. Static electrodes 1355 and moving electrodes 1350 are separated by small lateral gap 1360 and large lateral gap 1365 to form a capacitive sensor capable of measuring lateral acceleration. When an inertial force acts on the lateral accelerometer in the −x direction as shown in the x-y axis, proof mass 1340 moves in the −x direction due to the displacement of spring suspension 1330 supported by anchor 1310. The movement of proof mass 1340 also causes movement of array of moving electrodes 1350 in the −x direction, causing small lateral gap 1360 to become smaller and large lateral gap 1365 to be larger. The movement of moving electrodes 1350 due to the lateral inertial force relative to array of static electrodes 1355 causes a change in the differential capacitance by making the capacitance of small lateral gap 1360 larger and capacitance of large lateral gap 1365 smaller resulting in a net increase in the lateral capacitance, which is a measure of the input lateral acceleration. In the example embodiment, anchor 1310 coupled to moving electrodes is connected to a contact pad 1370. Anchor 1320 coupled to array of static electrodes 1355 is connected to contact pad 1375. Contact pad 1370 is electrically coupled to the capacitance plate of moving electrodes 1350. Contact pad 1375 is electrically coupled to the capacitance plate of static electrodes 1355 and the differential capacitance is electrically read and analyzed by an external circuit using as ASIC (Application Specific Integrated Circuit) to convert the input acceleration to an external equivalent electrical signal such as voltage.

Figure 14A:
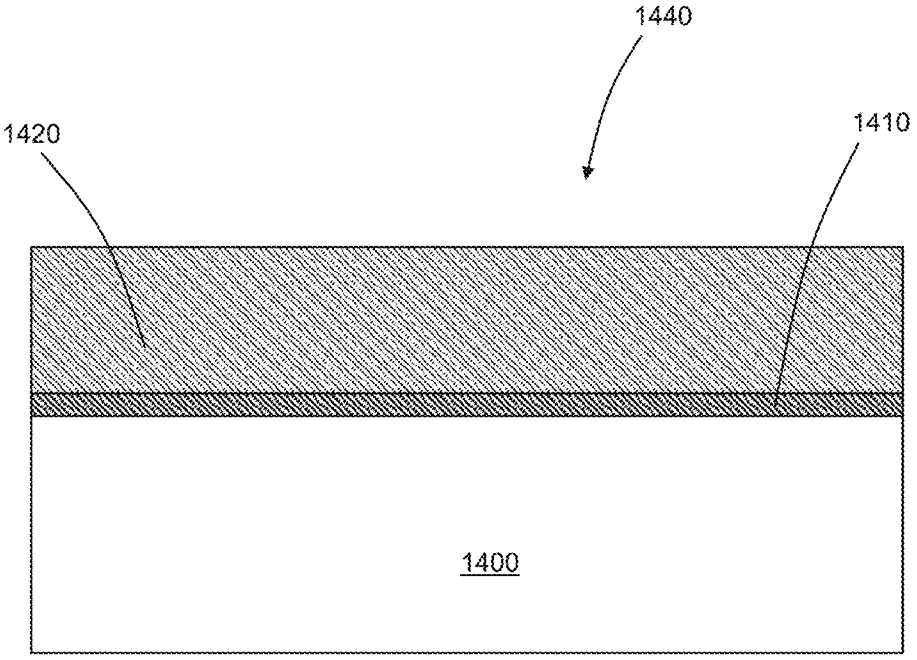
FIG. 14A is an illustration of an engineered substrate used to form a semiconductor device in accordance with an example embodiment.

FIG. 14A is an illustration of an engineered substrate 1440 used to form a semiconductor device in accordance with an alternate embodiment. In general, an anchor system is proposed hereinbelow that is stronger than a surface contacted anchor as disclosed herein above. Engineered substrate 1440 comprises of a semiconductor substrate 1400 of single crystalline material used for the formation of semiconductor devices. In the example embodiment, semiconductor substrate 1400 comprises single crystalline silicon, which may be doped with n-type or p-type dopant. In the example embodiment, semiconductor substrate 1400 comprises n-type doped single crystalline silicon. Engineered substrate 1440 further comprises an intermediate layer 1410 overlying a surface of semiconductor substrate 1400. Intermediate layer 1410 comprises an epitaxially grown single crystal layer that has zero or very low strain due to the relaxation of the crystalline structure by formation of a density of dislocations by breaking of bonds in the crystalline structure. In one embodiment, intermediate layer 1410 has a crystalline structure with a lattice constant different from the crystalline structure of semiconductor substrate 1400. Intermediate layer 1410 is grown beyond the critical thickness for the growth conditions of intermediate layer 1410 overlying semiconductor substrate 1400 resulting in a formation of a density of dislocations with zero or very low strain in intermediate layer 1410. In one embodiment, intermediate layer 1410 may be epitaxially grown in one or multiple layers ensuring that the critical thickness is exceeded for each sub-layer by controlling the gas flows, gas ratios, dopants concentration, temperatures, ramp rates and other growth parameters resulting in a relaxed composite layer with zero or very low strain. In the example embodiment, intermediate layer 1410 comprises silicon germanium with a composition of $Si_{70}Ge_{30}$ and is relaxed by growing the silicon germanium layer beyond the critical thickness with formation of a density of dislocations. In the example embodiment, intermediate layer 1410 has a thickness of (1-5) micron.

Engineered substrate 1440 further comprises a device layer 1420 overlying intermediate layer 1410. Device layer 1420 is utilized for the formation of semiconductor devices using engineered substrate 1400. Device layer 1420 comprises a single crystalline semiconductor material epitaxially grown overlying a surface of intermediate layer 1410 and is relaxed with zero or very low strain due to the growth of device layer 1420 beyond its critical thickness. In one embodiment, device layer 1420 has a crystalline structure different from the crystalline structure of underlying intermediate layer 1410 and is grown to a thickness beyond the critical thickness for the particular growth conditions for device layer 1420. In the example embodiment, device layer 1420 compromises single crystal silicon overlying intermediate layer 1410 comprising silicon germanium. In one embodiment, device layer 1420 is relaxed with zero or very low strain by growing to a thickness beyond the critical thickness corresponding to the growth conditions such as gas flows, temperatures, dopant species among other growth factors. In one embodiment, device layer 1420 may be grown in one layer or multiple layers such that the critical thickness is exceeded for each layer resulting in formation of a density of dislocations with corresponding zero or very low strain in device layer 1420. The thickness of device layer 1420 may be in the range of (10-100) micrometers and may be doped with n-type or p-type dopants. In the example embodiment, device layer 1420 is doped n-type and has a thickness of 50 micrometers. The surface of device layer 1420 may be polished to remove any roughness due to the epitaxial growth of device layer 1420 overlying intermediate layer 1410.

Figure 14B:
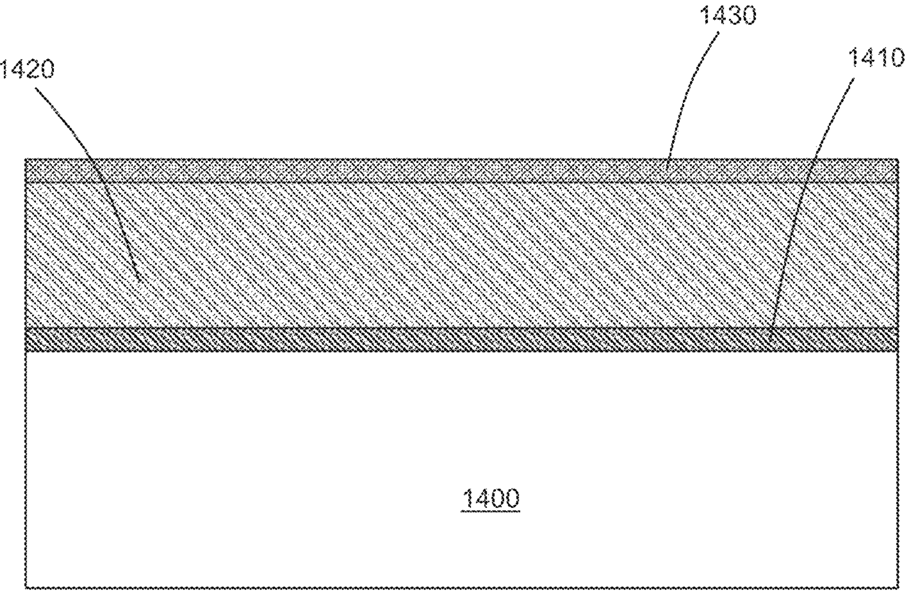
FIG. 14B is an illustration of a mask layer overlying surface of a device layer in accordance with an example embodiment.

FIG. 14B is an illustration of a mask layer 1430 overlying surface of device layer 1420 in accordance with an example embodiment. Mask layer 1430 may be formed by deposition of a dielectric or conductive layer to enable the transfer of a pattern to device layer 1420 using the techniques of lithography and etching, as well known to those skilled in the art, for the formation of semiconductor devices. Mask layer 1430 may be formed using a growth process or by deposition processes using CVD (Chemical Vapor Deposition), ALD (Atomic Layer Deposition) and other deposition techniques. Materials used for mask layer 1430 may comprise silicon oxide, silicon nitride, silicon carbide, aluminum oxide, aluminum nitride, PSG (Phosphosilicate Glass), BSG (Boron Silicon Glass), BPSG (BoronPhosphoSilicate Glass), Silicon oxynitride, among other materials. The thickness of mask layer 1430 may be in the range of 1000 A to 5 microns and is determined by the requirements of fabrication process steps that are subsequently described. In the example embodiment, mask layer 1430 comprises a silicon oxide layer that is deposited using LPCVD (Low Pressure Chemical Vapor Deposition) and the thickness is in the range of 0.5 to 2 micron.

Figure 15:
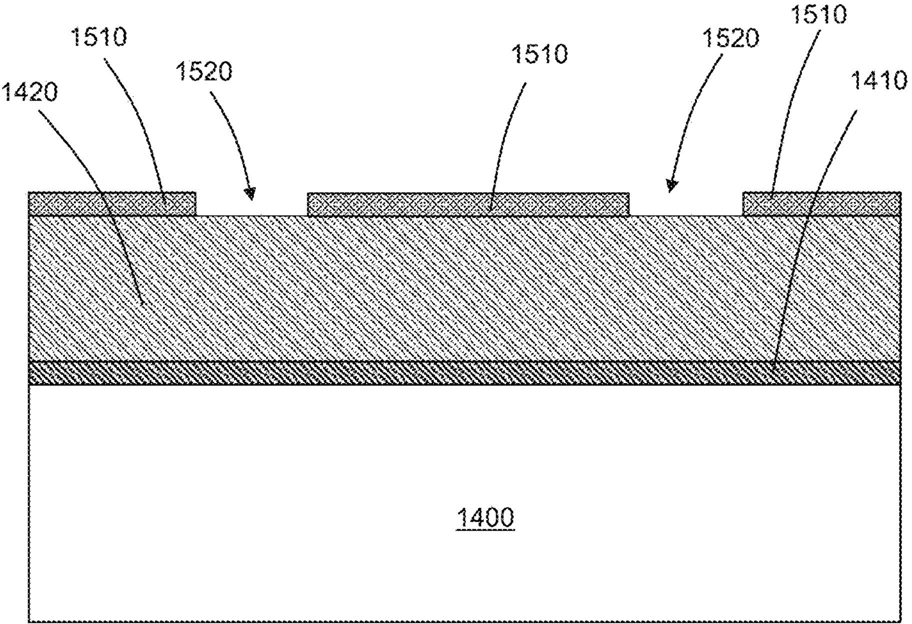
FIG. 15 is an illustration of the mask layer patterned in accordance with the example embodiment.

FIG. 15 is an illustration of mask layer 1430 patterned in accordance with the example embodiment using the techniques of lithography and etch as used in the fabrication of semiconductor devices. In the example embodiment, a mask or reticle is used to transfer a pattern to the surface of the silicon oxide comprising mask layer 1430. The mask pattern transfer is achieved using a photosensitive layer called photoresist with a lithography tool such as stepper, scanner, contact aligner, projection aligner, proximity aligner and other tools used for lithography pattern transfer. The transfer of the pattern to the photoresist is used to remove portions of mask layer 1430. Wet chemical etching or dry chemical etching using RIE (Reactive Ion Etching), or a combination of dry and wet chemical etching may be used to pattern mask layer 1430. In the example embodiment, mask layer 1430 comprising silicon oxide is patterned with a positive photoresist using RIE (Reactive Ion Etching) with fluorine chemistry such as $SF_6$ to form regions of patterned mask layer 1510 and openings 1520. Openings 1520 in mask layer 1430 are regions in mask layer 1430 where RIE is utilized to expose regions of device layer 1420. The width of openings 1520 may be in the range of 1 micron to 10 microns and is determined by the requirement of the design of the semiconductor device formed in subsequent steps.

Figure 16:
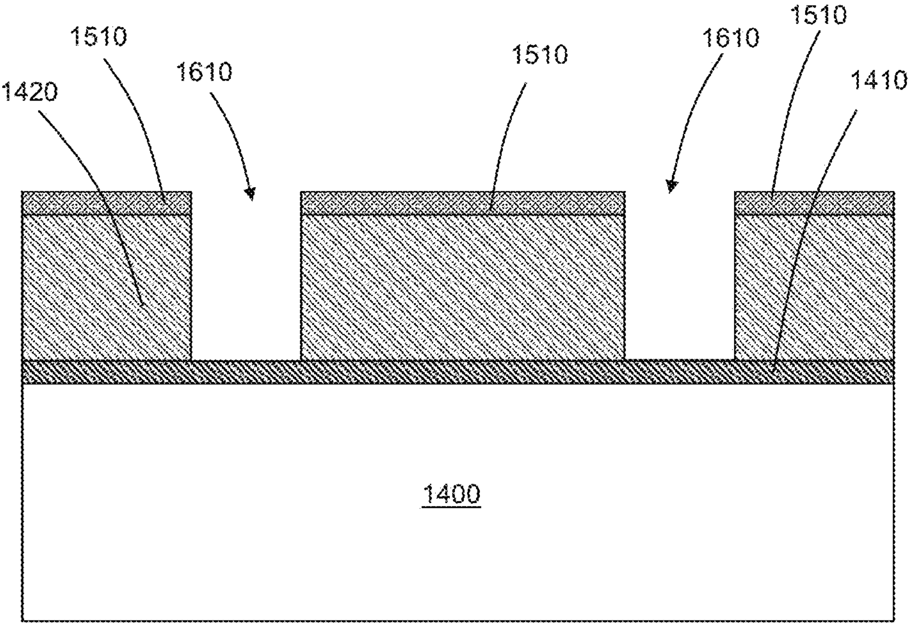
FIG. 16 is an illustration of openings formed in the device layer in accordance with an example embodiment.

FIG. 16 is an illustration of openings 1610 formed in device layer 1420 in accordance with an example embodiment. Openings 1610 formed in device layer 1420 are patterned using high aspect ratio etching techniques such as DRIE (Deep Reactive Ion Etching). In the example embodiment, regions of patterned mask layer 1510 are used to etch high aspect ratio trenches in device layer 1420 comprising single crystal silicon by using the BOSCH DRIE (Deep Reactive Ion Etching) process using $SF_6$ chemistry and alternate cycle of etch using $SF_6$ and passivation using a polymer to form high aspect ratio trenches.

Figure 17:
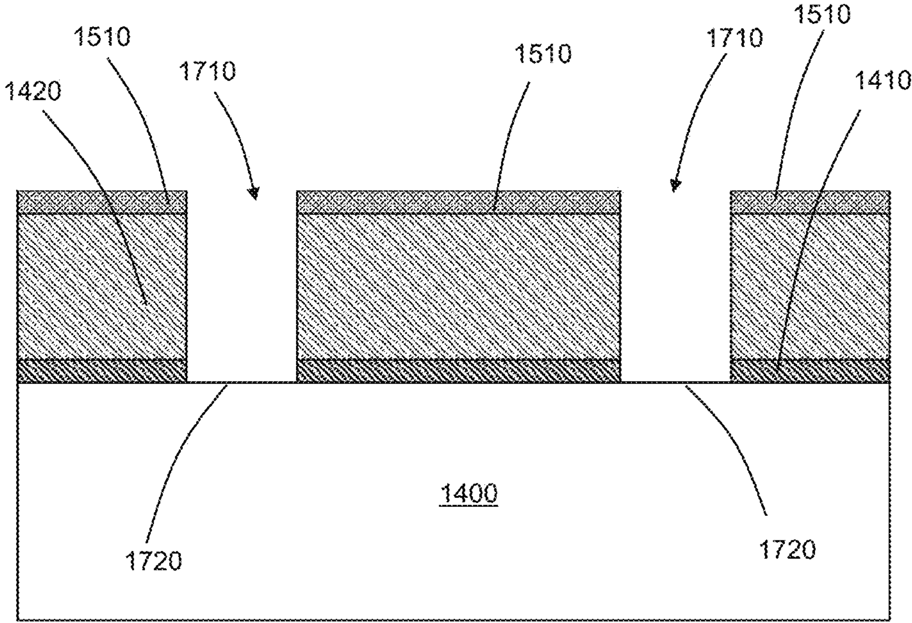
FIG. 17 is an illustration of openings formed in the device layer and intermediate layer in accordance with an example embodiment.

FIG. 17 is an illustration of openings 1710 formed in device layer 1420 and intermediate layer 1410 in accordance with an example embodiment. Openings 1710 are formed using high aspect ratio techniques such as DRIE (Deep Reactive Ion Etching). In the example embodiment, portions of intermediate layer 1410 exposed by openings 1610 from FIG. 16 are etched using DRIE to form openings 1710 and form exposed regions 1720 of underlying semiconductor substrate 1400. In another embodiment, openings 1710 may be formed by removing portions of device layer 1420 and intermediate layer 1410 in one etching step with DRIE resulting in exposed regions 1720 of underlying semiconductor substrate 1400.

Figure 18:
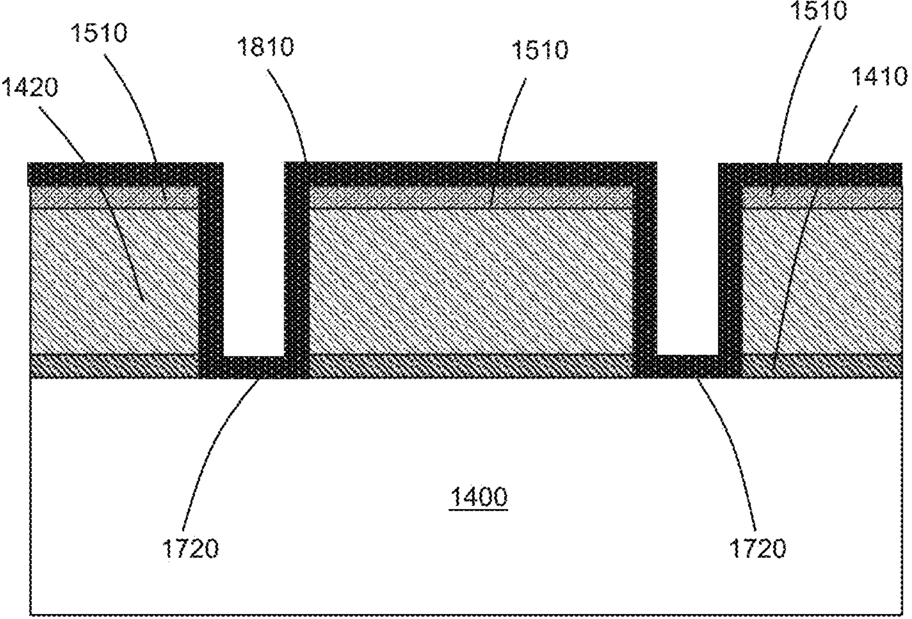
FIG. 18 is an illustration of a conformal layer deposited over the patterned mask layer, sidewalls of openings formed in the device layer and intermediate layer, and exposed regions of the substrate in accordance with an example embodiment.

FIG. 18 is an illustration of a conformal layer 1810 deposited over patterned mask layer 1510, sidewalls of openings 1710 formed in device layer 1420 and intermediate layer 1410, and exposed regions 1720 of semiconductor substrate 1400, in accordance with an example embodiment. Conformal layer 1810 is deposited by using CVD processes such as LPCVD (Low Pressure Chemical Vapor Deposition), SACVD (Sub-Atmospheric Chemical Vapor Deposition) as well as deposition methods such as ALD (Atomic Layer Deposition). Conformal layer 1810 may comprise of one or more layers that are deposited. In the example embodiment, conformal layer 1810 comprises LPCVD silicon nitride and has a thickness in the range of 0.2 to 1 micrometer.

Figure 19:
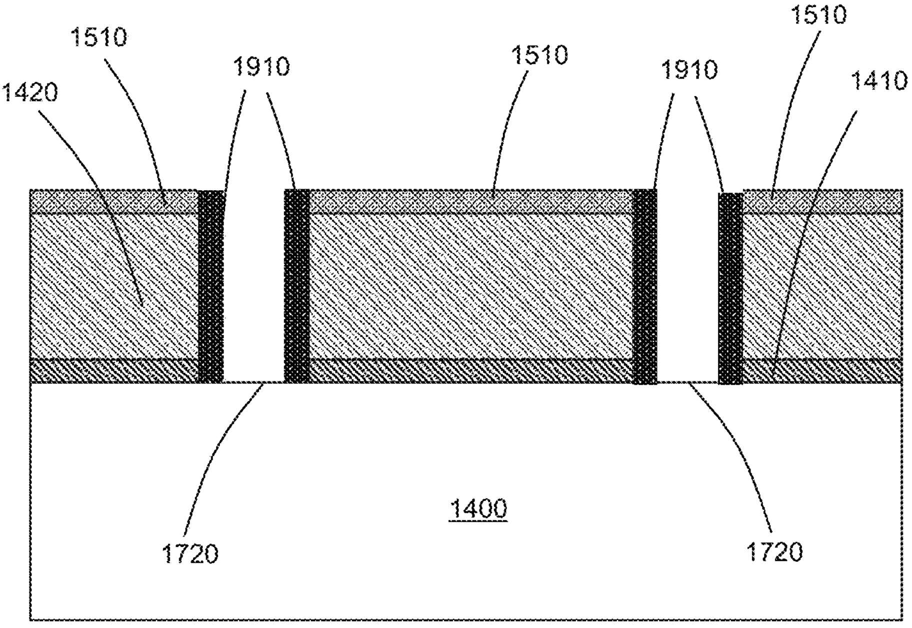
FIG. 19 is an illustration of sidewall spacers formed overlying sidewalls of the openings comprising the device layer and intermediate layer in accordance with an example embodiment.

FIG. 19 is an illustration of sidewall spacers 1910 formed overlying the sidewalls of openings 1710 comprising device layer 1420 and intermediate layer 1410 in accordance with an example embodiment. Conformal layer 1810 from FIG. 18 is etched using a blanket etch process to remove portions of conformal layer 1810 from surface of patterned mask layer 1510 as well as portions of exposed regions 1720 of semiconductor substrate 1400 in openings 1710 such that sidewall spacers 1910 remain. In the example embodiment, conformal layer 1810 comprising LPCVD silicon nitride is removed by using a blanket etch back using RIE (Reactive Ion Etching) with fluorine chemistry such as $CF_4$, $CHF_3$, $SF_6$ among other process gases leaving sidewall spacers 1910 of LPCVD silicon nitride. In one embodiment, conformal layer 1810 comprises a first dielectric layer such as LPCVD silicon nitride.

Figure 20:
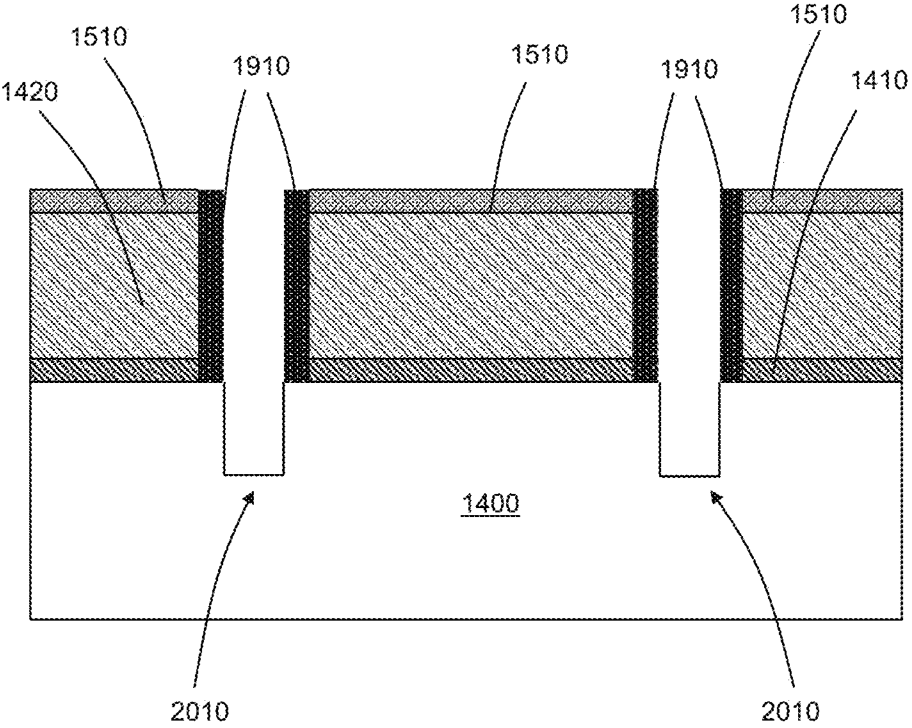
FIG. 20 is an illustration showing the formation of the trenches formed in the semiconductor substrate, in accordance with an example embodiment.

FIG. 20 is an illustration showing the formation of trenches 2010 formed in semiconductor substrate 1400, in accordance with an example embodiment. Trenches 2010 are formed in semiconductor substrate 1400 using DRIE and are self-aligned to sidewall spacers 1910 formed overlying the sidewalls of openings 1710 that cover device layer 1420 and intermediate layer 1410. In the example embodiment, trenches 2010 are formed in semiconductor substrate 1400 comprising single crystal silicon and have a depth of (0.5-5.0) micrometers. Trenches 2010 are etched using DRIE using an etch cycle with $SF_6$ chemistry and passivation using a polymer formed on the sidewalls of trenches 2010 to achieve a high aspect ratio.

Figure 21:
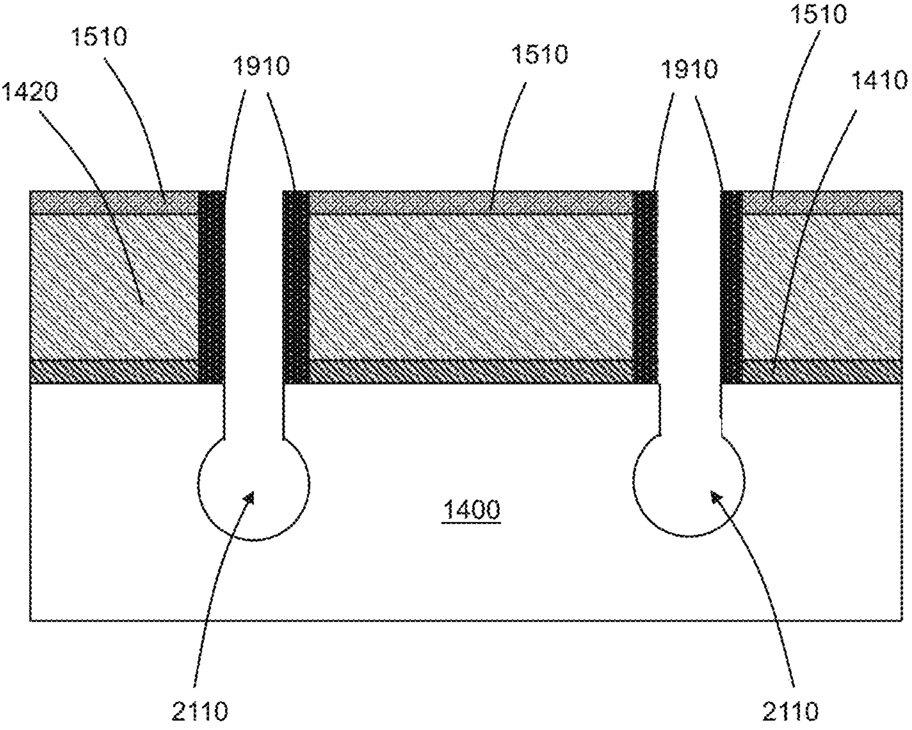
FIG. 21 is an illustration of the isotropic trenches formed below the trenches in the semiconductor substrate in accordance with an example embodiment.

FIG. 21 is an illustration of isotropic trenches 2110 formed below trenches 2010 of FIG. 20 in semiconductor substrate 1400 in accordance with an example embodiment. Isotropic trenches 2110 are formed below trenches 2010 from FIG. 20 by using isotropic etching to remove portions of semiconductor substrate 1400 in an isotropic manner. In the example embodiment, semiconductor substrate 1400 comprises single crystal silicon and isotropic trenches 2110 are formed by etching portions of semiconductor substrate around polymer formed in walls of trenches 2010 of FIG. 20 by using xenon difluoride ($XeF_2$). Isotropic trenches 2110 may have a diameter between (3-10) micrometers and is dependent on the width and depth of trenches 2010.

Figure 22:
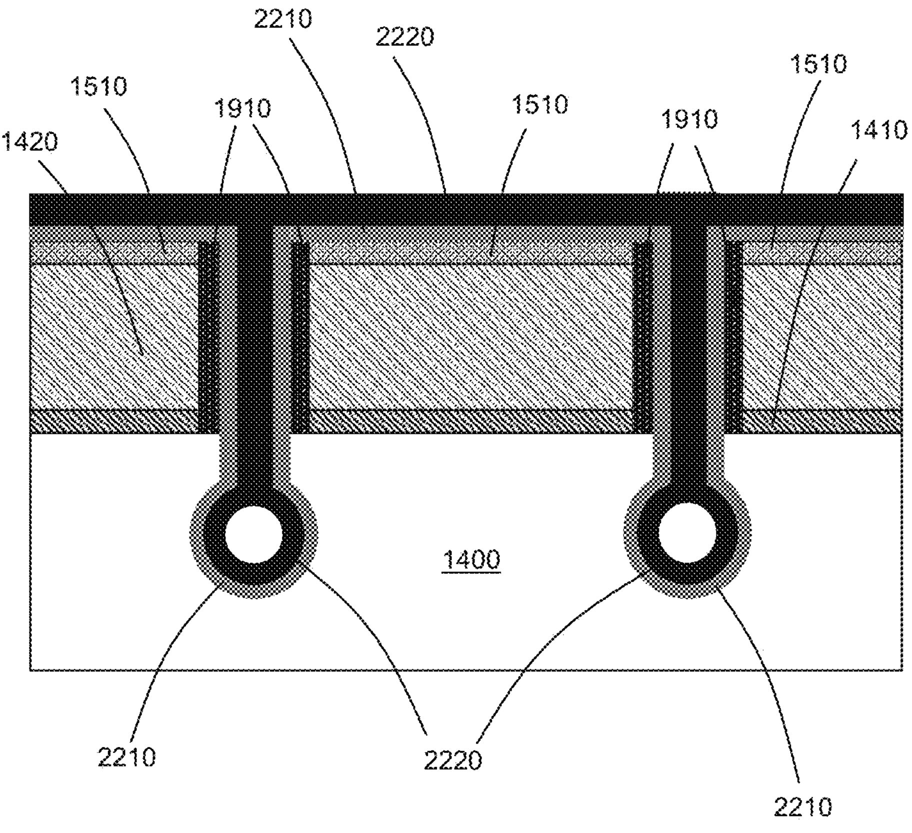
FIG. 22 is an illustration of a refill of the openings in accordance with an example embodiment.

FIG. 22 is an illustration of a refill of openings 1710 of FIG. 17 in accordance with an example embodiment. In the example embodiment, the refill is configured to fill openings 1710 that includes etched regions in device layer 1420 and intermediate layer 1410 of FIG. 17, trenches 2010 of FIG. 20, and isotropic trenches 2110 of FIG. 21. Dielectric layer 2210 and refill layer 2220 are used to refill openings 1710 as disclosed herein above. In one embodiment, dielectric layer 2210 comprises a conformally deposited layer that is electrically insulating. In one embodiment, refill layer 2220 comprises a conformally deposited layer that may be electrically conductive or insulating. In the example embodiment, dielectric layer 2210 comprises LPCVD silicon nitride and refill layer 2220 comprises LPCVD polysilicon. In another embodiment, dielectric layer 2210 comprises LPCVD silicon nitride and refill layer 2220 comprises another layer of LPCVD silicon nitride. In another embodiment, dielectric layer 2210 may comprise multiple layers and refill layer 2220 may also comprise multiple layers.

Figure 23:
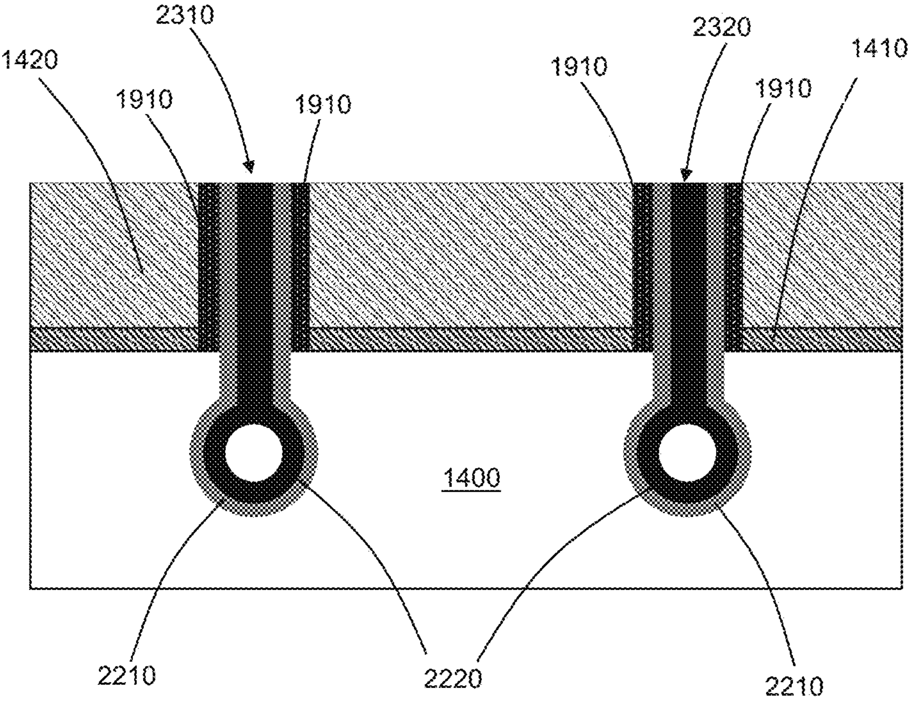
FIG. 23 is an illustration showing the formation of anchor structures in accordance with an example embodiment.

FIG. 23 is an illustration showing the formation of anchor structures 2310 and 2320 in accordance with an example embodiment. Anchor structures 2310 and 2320 are formed by removal of refill layer 2220 and dielectric layer 2210 from FIG. 22 and patterned mask layer 1510 from FIG. 15 using CMP (Chemical Mechanical Polishing) to expose surface of device layer 1420. A predetermined thickness of device layer 1420 may also be removed by the CMP process. Anchor structures 2310 and 2320 comprise sidewall spacer 1910 deposited on sidewalls of openings 1710 of FIG. 17 comprising device layer 1420 and intermediate layer 1410 of FIG. 14, dielectric layer 2210, and refill layer 2220 of FIG. 22. In the example embodiment, the refill of openings 1710 of FIG. 17 also includes isotropic trenches 2110 and trenches 2010 in FIG. 21 recessed below surface of semiconductor substrate 1400.

Figure 24:
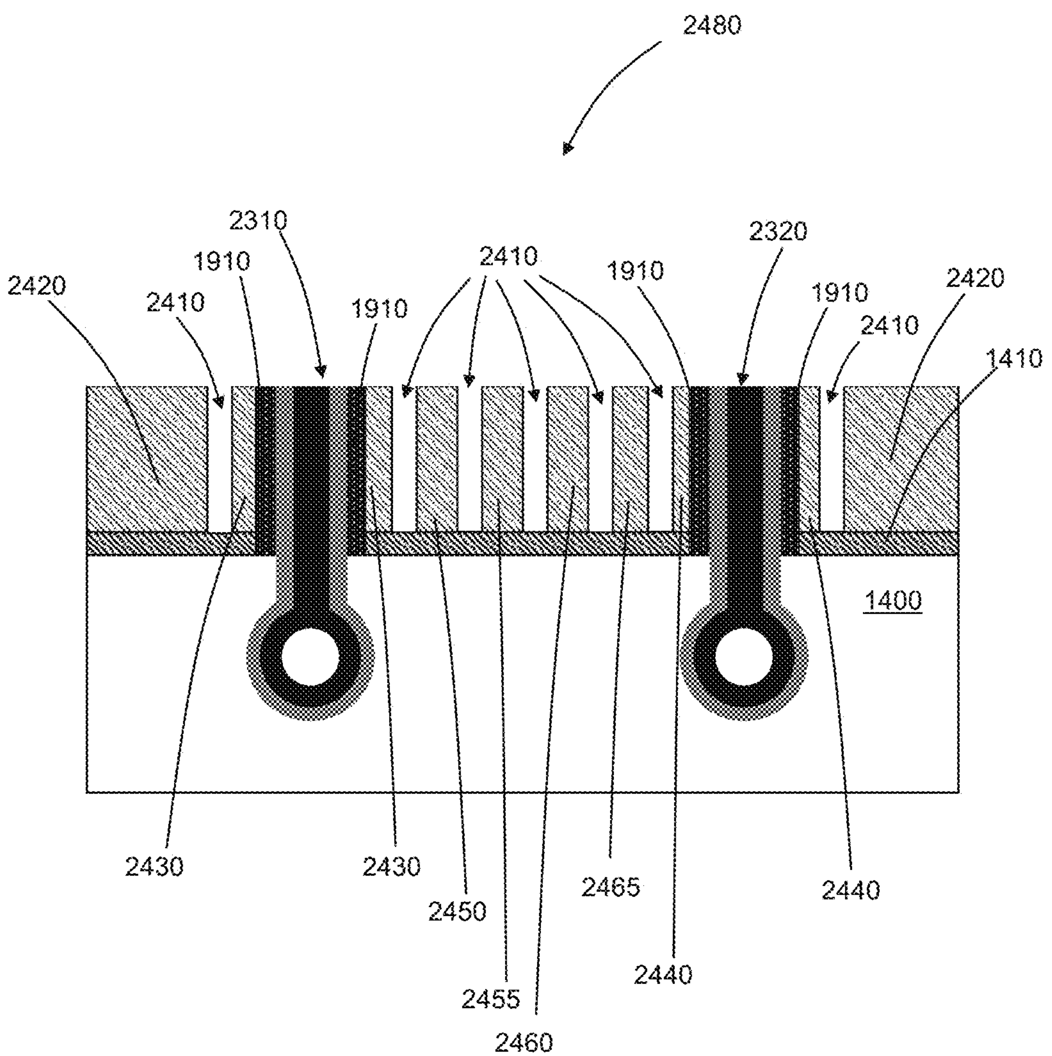
FIG. 24 is an illustration showing the formation of openings in the device layer in accordance with an example embodiment.

FIG. 24 is an illustration showing the formation of openings 2410 formed in device layer 1420 of FIG. 23 in accordance with an example embodiment. Openings 2410 are formed in device layer 1420 of FIG. 23 to enable formation of a semiconductor device 2480. In the example embodiment, semiconductor device 2480 comprises a MEMS sensor. In the example embodiment, openings 2410 are formed by using the technique of lithography to transfer a pattern to the surface of device layer 1420 and then using the technique of etching to selectively remove portions of device layer 1420 with an array of trenches. In the example embodiment, DRIE (Deep Reactive Ion Etching) is used to etch high aspect ratio trenches forming openings 2410 exposing portions of underlying intermediate layer 1410. Openings 2410 form an array of high aspect ratio trenches since the height of the trenches are much more than the width of the trenches and may be in the range of 10:1 or more. Openings 2410 formed in device layer 1420 results in the formation of patterned device layer 2420, 2430, 2440, 2450, 2455, 2460 and 2465. Patterned device layers (2420-2465) are used to form elements of semiconductor device 2480 and serve specific functions in semiconductor device 2480. In the example embodiment, semiconductor device 2480 comprises an inertial sensor such as an accelerometer or gyroscope that responds to an input physical comprising inertial force and produces an output equivalent electrical signal such as voltage, current, among other electrical signals.

Figure 25:
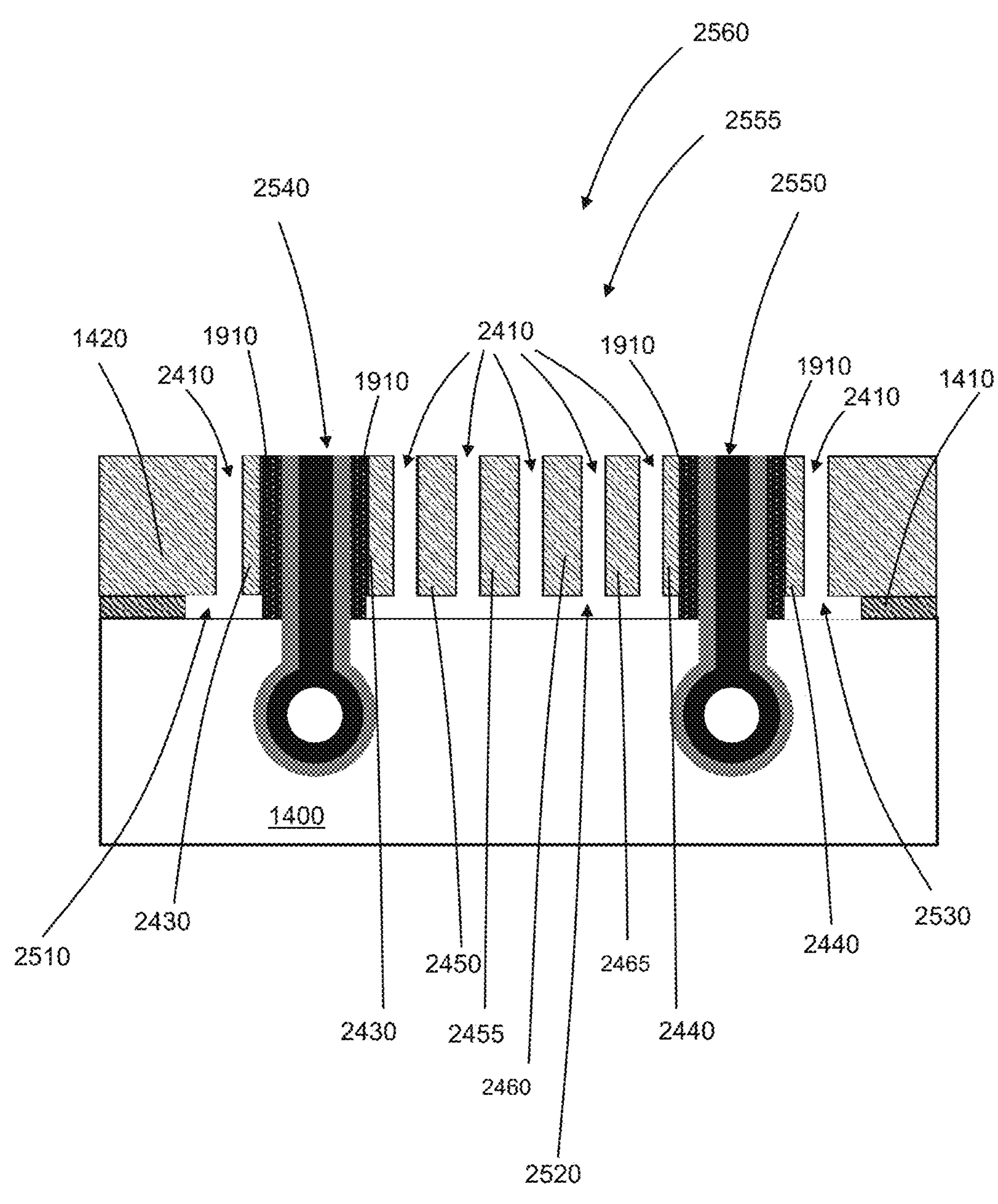
FIG. 25 is an illustration of an inertial sensor formed in accordance with an example embodiment.

FIG. 25 is an illustration of an inertial sensor 2560 formed in accordance with an example embodiment. In the example embodiment, semiconductor device 2480 from FIG. 24 comprising a MEMS device is further processed using semiconductor wafer processing steps to form inertial sensor 2560. In FIG. 25, openings 2410 formed in device layer 1420 are used to selectively remove portions of intermediate layer 1410 by forming undercut regions 2510, 2520 and 2530 below device layer 1420. Note that anchors 2540 and 2550 remain attached to substrate 1400 after undercut regions 2510, 2520, and 2530 are formed.

In FIG. 25, anchor 2540 comprises patterned device layer 2430 attached to anchor structure 2310 and anchor 2550 comprises of patterned device layer 2440 attached to anchor structure 2320. Anchor 2540 is attached to semiconductor substrate 1400 by a composite structure comprising patterned device layer 2430 mechanically coupled to sidewall spacer 1910 which is mechanically coupled to dielectric layer 2210 and refill layer 2220. Anchor 2540 is physically coupled to semiconductor substrate 1400 and electrically isolated from semiconductor substrate 1400 by dielectric layer 2210. In the example embodiment, anchor 2540 can serve as a static electrode for inertial sensor 2560.

Anchor 2550 is attached to semiconductor substrate 1400 by a composite structure comprising patterned device layer 2440 mechanically coupled to sidewall spacer 1910 which is mechanically coupled to dielectric layer 2210 and refill layer 2220. Anchor 2550 is physically coupled to semiconductor substrate 1400 and electrically isolated from semiconductor substrate 1400 by dielectric layer 2210.

In the example embodiment, anchor 2550 is mechanically and electrically coupled to patterned device layer 2450, 2455, 2460, and 2465 to form a portion of a moving mass 2555 that is capable to responding to input inertial forces since the portions of intermediate layer 1410 of FIG. 24 are removed by formation of undercut region 2510, 2520 and 2530.

In the example embodiment, the formation of undercut regions 2510, 2520 and 2530 in intermediate layer 1410 may be accomplished by a selective etching process. In the example embodiment, openings 2410 in device layer 1420 of FIG. 23 comprising single crystal silicon are used to introduce etchants to selectively remove portions of intermediate layer 1410 comprising single crystal silicon germanium to form undercut regions 2510, 2520 and 2530 below device layer 1420. The etchant that is used to remove portions of intermediate layer 1410 is highly selective to device layer 1420 of FIG. 23 and semiconductor substrate 1400. The etching process may use wet, dry, vapor or gaseous etchant. In the example embodiment, vapor hydrochloric acid (HCl) is used to selectively etch portions of intermediate layer 1410 comprising single crystal SiGe through openings 2410 in device layer 1420 of FIG. 23 comprising single crystal silicon to form undercut regions 2510, 2520 and 2530. Undercut regions 2510, 2520, and 2530 form a gap between portions of patterned device layer 2430, 2440, 2450, 2455, 2460, and 2465 and semiconductor substrate 1400 comprising single crystal silicon. Vapor HCl may be diluted with a carrier gas such as hydrogen, nitrogen, argon among carrier gases and the etching pressure may be in vacuum or in atmospheric pressure. The temperature at which the etching of intermediate layer 1410 is carried out may be in the range of (250-1100°) C and the flow rate of the gases may be modified to achieve the desired etch rate and selectivity.

In FIG. 25, the selective removal of intermediate layer 1410 below patterned device layer 2430, 2440, 2450, 2455, 2460, and 2465 by formation of undercut regions 2510, 2520 and 2530 enables the movement of moving mass 2555 comprising patterned device layer 2440, 2450, 2455, 2460 and 2465 to be anchored to semiconductor substrate 1400 by anchor 2550 and moving with respect to anchor 2540. Patterned device layer 2440, 2450, 2455, 2460 and 2465 may comprise different components of moving mass 2555 such as suspension spring, proof mass, sensing electrode, coupling beam and other elements of inertial sensor 2560. The relative motion of moving mass 2555 of inertial sensor 2560 with respect to static structure such as anchor 2540 forming a static electrode may be transduced to an equivalent electrical parameter such as capacitance which is converted by an integrated circuit to an equivalent electrical signal such as voltage, current, frequency and similar electrical parameter.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

The descriptions disclosed herein below will call out components, materials, inputs, or outputs from FIGS. 1-25.

In one embodiment, a semiconductor device 1180 having one or more anchors 1116 to support a moving mass 1240 comprises a semiconductor substrate 100, an intermediate layer 210 overlying semiconductor substrate 100 and a device layer 310 overlying intermediate layer 210 wherein semiconductor substrate 100, intermediate layer 210 and device layer 310 are single crystal and wherein moving mass 1240 is formed in device layer 310. In one embodiment, at least one anchor 1116 is configured to anchor moving mass 1240 such that anchor 1116 comprises a dielectric material coupled to semiconductor substrate 100. In one embodiment, moving mass 1240 couples at least one anchor 1116 and wherein intermediate layer 210 is configured to be removed underlying moving mass 1240.

In one embodiment, semiconductor device 1180 further includes at least one spring coupled between one anchor 1116 and moving mass 1240. In one embodiment, the spring forms a spring suspension 1330 to couple anchor 1310 and moving mass 1240.

In one embodiment, semiconductor device 1180, comprising semiconductor substrate 100 and device layer 310, comprises silicon, and intermediate layer 210 comprises Silicon Germanium (SiGe).

In one embodiment, semiconductor device 1180 comprising semiconductor substrate 100, device layer 310 and intermediate layer 210 are relaxed.

In one embodiment, intermediate layer 210 comprises two or more layers grown by epitaxy and wherein each layer of the two or more layers of intermediate layer 210 are configured to be grown above a critical thickness of silicon germanium to be relaxed.

In one embodiment, device layer 310 comprises two or more layers grown by epitaxy and wherein each layer of the two or more layers of device layer 310 are configured to be grown above a critical thickness of silicon to be relaxed.

In one embodiment, semiconductor device 1180 comprises semiconductor substrate 100 configured to be placed in an epitaxial reactor and wherein intermediate layer 210 and device layer 310 is configured to be grown in the epitaxial reactor.

In one embodiment, at least one anchor 1116 comprises a dielectric layer 810 and a refill layer 820. In one embodiment, refill layer 820 comprises a dielectric or a conductive material.

In one embodiment, semiconductor device 1180 includes a first electrode coupled to moving mass 1240 and a second electrode coupled to a stationary mass wherein moving mass 1240 and the stationary mass are configured as a variable capacitor that changes capacitance as moving mass 1240 moves in relation to the stationary mass and wherein a capacitance of the variable capacitor is configured to be measured at the first and second electrodes.

In one embodiment, at least one anchor 2550 that couples to the moving mass 2555 is configured to be formed below a surface of semiconductor substrate 1400.

In one embodiment, a method of forming at least one anchor 1116 coupled to a moving mass 1240 for a Micro-Electrical-Mechanical system (MEMS) device 1300 comprises the steps of growing an intermediate layer 210 by epitaxy overlying a semiconductor substrate 100, growing a device layer 310 by epitaxy overlying intermediate layer 210 wherein semiconductor substrate 100, intermediate layer 210, and device layer 310 are single crystal and wherein intermediate layer 210 and device layer 310 are relaxed.

The method further comprises the steps of patterning a first mask layer 510, etching device layer 310 and intermediate layer 210 as defined by first mask layer 510, wherein a surface of semiconductor substrate 100 is exposed after the etch, depositing a dielectric layer 810, depositing a refill layer 820, etching back refill layer 820 and dielectric layer 810 to expose first mask layer 510, and removing first mask layer 510 wherein at least one anchor 1116 comprises dielectric layer 810 and refill layer 820 coupled to semiconductor substrate 100.

In one embodiment, the method of forming at least one anchor 1116 further comprising the step of growing intermediate layer 210 by epitaxy further includes a step of growing two or more layers of intermediate layer 210 by epitaxy wherein each layer of the two or more layers of intermediate layer 210 is grown beyond a critical thickness to relax intermediate layer 210.

In one embodiment, the method of forming at least one anchor 1116 further comprising the step of growing device layer 310 by epitaxy further includes a step of growing two or more layers of device layer 310 by epitaxy wherein each layer of the two or more layers of device layer 310 is grown beyond a critical thickness to relax device layer 310.

In one embodiment, the method of forming at least one anchor 1116 further includes a step of polishing a surface of device layer 310 prior to depositing first mask layer 510.

In one embodiment, the method of forming at least one anchor 1116 further comprises the steps of growing intermediate layer 210 in an epitaxial reactor wherein intermediate layer 210 is silicon germanium (SiGe) and growing device layer 310 overlying intermediate layer 210 in the epitaxial reactor wherein device layer 310 is silicon.

In one embodiment, the method of forming at least one anchor 1116 comprising the step of etching device layer 310 and intermediate layer 210 comprises deep reactive ion etching (DRIE).

In one embodiment, the method of forming at least one anchor 1116 comprising the step of depositing dielectric layer 810 comprises a step of depositing silicon nitride as dielectric layer 810.

In one embodiment, the method of forming at least one anchor 1116 comprising the step of depositing refill layer 820 comprises depositing a dielectric material or a conductive material as refill layer 820.

In one embodiment, the method of forming at least one anchor 1116 comprising the step of etching back refill layer 820 and dielectric layer 810 to expose first mask layer 510 includes a step of removing first dielectric layer 810 and refill layer 820 at or below a surface of first mask layer 510.

In one embodiment, the method of forming at least one anchor 1116 comprising the step of etching back refill layer 820 and dielectric layer 810 to expose first mask layer 510 includes a step of chemical mechanical planarization (CMP).

In one embodiment, the method of forming at least one anchor 1116 further comprises the steps of patterning a second mask layer, etching a region of device layer 310 in one or more locations as defined by the second mask layer wherein a surface of intermediate layer 210 in the one or more locations defined by the second mask layer is exposed after the etch, and etching intermediate layer 210 underlying the region wherein etching intermediate layer 210 underlying the region releases the region to form moving mass 1240, wherein moving mass 1240 couples to at least one anchor 1116, and wherein moving mass 1240 is configured to move relative to semiconductor substrate 100.

In one embodiment, the method of forming at least one anchor 1116 wherein the step of etching intermediate layer 210 underlying the region further includes a step of etching intermediate layer 210 underlying the region using vapor hydrochloric acid (HCl).

In one embodiment, a method of forming at least one anchor 2550 coupled to a moving mass 2555 for a Micro-Electro-Mechanical system (MEMS) device comprises the steps of growing an intermediate layer 1410 overlying a semiconductor substrate 1400 wherein intermediate layer 1410 comprises SiGe, growing a device layer 1420 overlying intermediate layer 1410 wherein semiconductor substrate 1400 and device layer 1420 comprise silicon, wherein semiconductor substrate 1400, intermediate layer 1410, and device layer 1420 are single crystal, and wherein device layer 1420 and intermediate layer 1410 are relaxed.

The method further comprises the steps of forming at least one anchor 2550 coupled to semiconductor substrate 1400 wherein at least one anchor 2550 comprises a dielectric material, wherein moving mass 2555 comprises a region of device layer 1420, wherein intermediate layer 1410 is removed underlying moving mass 2555, and wherein at least one anchor 2550 is configured to support movement of moving mass 2555 in relation to semiconductor substrate 1400.

In one embodiment, the method of forming at least one anchor 2550 coupled to moving mass 2555 comprising the step of growing intermediate layer 1410 includes a step of growing two or more layers by epitaxy to form intermediate layer 1410 wherein each of the two or more layers of intermediate layer 1410 are grown beyond a critical thickness to relax intermediate layer 1410.

In one embodiment, the method of forming at least one anchor 2550 coupled to moving mass 2555 comprising the step of growing device layer 1420 includes a step of growing two or more layers by epitaxy to form device layer 1420 wherein each of the two or more layers of device layer 1420 are grown beyond a critical thickness to relax device layer 1420.

In one embodiment, the method of forming at least one anchor 2550 coupled to moving mass 2555 wherein at least one anchor 2550 is formed at or below a surface of semiconductor substrate 1400.

In one embodiment, the method of forming at least one anchor 2550 coupled to moving mass 2555 further includes the steps of patterning a first mask layer 1430, etching a cavity in device layer 1420 and intermediate layer 1410 as defined by first mask layer 1430 wherein device layer 1420 and intermediate layer 1410 is etched exposing semiconductor substrate 1400 in the cavity, depositing a first dielectric layer forming a conformal layer 1810, etching the first dielectric layer such that the dielectric layer remains on sidewalls of the cavity in the region of device layer 1420 and etching semiconductor substrate 1400 exposed in the cavity to extend the cavity into semiconductor substrate 1400.

In one embodiment, the method of forming at least one anchor 2550 coupled to moving mass 2555 further includes a step of isotropically etching semiconductor substrate 1400 to further extend the cavity into semiconductor substrate 1400.

In one embodiment, the method of forming at least one anchor 2550 coupled to moving mass 2555 further includes the steps of depositing a second dielectric layer 2210 wherein second dielectric layer 2210 overlies the first dielectric layer on the sidewalls of the cavity and wherein second dielectric layer 2210 overlies a surface of semiconductor substrate 1400 in the cavity, depositing a refill layer 2220 overlying second dielectric layer 2210, and removing first mask layer 1430, second dielectric layer 2210, and refill layer 2220 to expose a surface of device layer 1420 wherein the cavity in device layer 1420 comprising the first dielectric, the second dielectric, and the refill layer comprises at least one anchor 2550.

In one embodiment, the method of forming at least one anchor 2550 coupled to moving mass 2555 wherein refill layer 2220 comprises a dielectric material or a conductive material.

In one embodiment, the method of forming at least one anchor 2550 coupled to moving mass 2555 further includes the steps of patterning a second mask layer to expose one or more locations in a region of device layer 1420, etching device layer 1420 in the one or more locations in the region as defined by the second mask layer to expose underlying intermediate layer 1410, etching intermediate layer 1410 underlying the region wherein etching intermediate layer 1410 releases the region to form moving mass 2555, wherein moving mass 2555 couples to anchor 2550, and wherein moving mass 2555 is configured to move relative to semiconductor substrate 1400.

In one embodiment, the method of forming at least one anchor 2550 coupled to moving mass 2555 wherein the step of etching intermediate layer 1410 underlying the region includes a step of etching intermediate layer 1410 underlying the region with vapor hydrochloric acid (HCl).

In one embodiment, the method of forming at least one anchor 2550 coupled to moving mass 2555 wherein a spring couples at least one anchor 2550 to moving mass 2555.

What is claimed is:

1. A semiconductor device having one or more anchors configured to support a moving mass, the semiconductor device comprising:

a semiconductor substrate;

an intermediate layer overlying the semiconductor substrate;

a device layer formed overlying the intermediate layer, wherein materials of the semiconductor substrate, the intermediate layer, and the device layer are single crystal materials, and wherein the moving mass is formed in the device layer; and at least one anchor supporting the moving mass, the at least one anchor comprising a dielectric material coupled to the semiconductor substrate, wherein the moving mass is coupled to the at least one anchor, and wherein the intermediate layer is absent under the moving mass, and wherein the at least one anchor that is coupled to the moving mass is formed below a surface of the semiconductor substrate.

2. The semiconductor device of claim 1, further including at least one spring coupled between the at least one anchor and the moving mass.

3. The semiconductor device of claim 1, wherein the semiconductor substrate and the device layer include silicon, and wherein the intermediate layer comprises Silicon Germanium (SiGe).

4. The semiconductor device of claim 3, wherein the device layer and the intermediate layer are relaxed.

5. The semiconductor device of claim 4, wherein the intermediate layer comprises two or more layers grown by epitaxy, and wherein each layer of the two or more layers of the intermediate layer has a thickness exceeding a critical thickness of the intermediate layer.

6. The semiconductor device of claim 5, wherein the device layer comprises two or more layers grown by epitaxy, and wherein each layer of the two or more layers of the device layer has a thickness exceeding a critical thickness of the device layer.

7. The semiconductor device of claim 1, wherein the at least one anchor comprises a dielectric layer and a refill layer.

8. The semiconductor device of claim 1, wherein a refill layer of the at least one anchor comprises a dielectric material or a conductive material.

9. The semiconductor device of claim 1, wherein the semiconductor device further includes:

a first electrode coupled to the moving mass; and a second electrode coupled to a stationary mass, wherein the moving mass and the stationary mass are configured as a variable capacitor that changes a capacitance as the moving mass moves in relation to the stationary mass, and wherein the capacitance of the variable capacitor is measurable at the first and second electrodes.

10. The semiconductor device of claim 1, wherein the semiconductor substrate is a single crystal semiconductor substrate, wherein the at least one anchor is formed in a trench extending into the semiconductor substrate below a top surface of the semiconductor substrate and in contact with the single crystal semiconductor substrate below the top surface, the at least one anchor comprising:

a dielectric layer on trench sidewalls within the device layer and within the semiconductor substrate, and a refill material occupying a remaining trench volume above the top surface.

11. The semiconductor device of claim 10, wherein a portion of a trench volume below the top surface is devoid of the dielectric layer and the refill material.

12. The semiconductor device of claim 1, wherein the semiconductor substrate is a single crystal semiconductor substrate, wherein the at least one anchor is formed in a trench extending into the semiconductor substrate below a top surface of the semiconductor substrate and in contact with the single crystal semiconductor substrate below the top surface, the at least one anchor comprising:

a refill material separated from trench walls within the device layer and occupying a portion of a trench volume.

13. The semiconductor device of claim 12, wherein the refill material occupies the portions of the trench volume both above and below the top surface.

* * * * *